(12) United States Patent
Ravinuthula et al.

(10) Patent No.: US 11,567,549 B2
(45) Date of Patent: Jan. 31, 2023

(54) RESET CIRCUIT FOR BATTERY MANAGEMENT SYSTEM

(71) Applicant: TEXAS INSTRUMENTS INCORPORATED, Dallas, TX (US)

(72) Inventors: Vishnu Vardhan Ravinuthula, Dallas, TX (US); Wan Laan Jackie Hui, Allen, TX (US); Indranil Gangopadhyay, Plano, TX (US); Quanqing Hu, Irving, TX (US); Madhu Dundaiah, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 235 days.

(21) Appl. No.: 16/888,113

(22) Filed: May 29, 2020

(65) Prior Publication Data
US 2020/0381926 A1 Dec. 3, 2020

Related U.S. Application Data

(60) Provisional application No. 62/855,570, filed on May 31, 2019.

(51) Int. Cl.
*H01M 10/42* (2006.01)
*G06F 1/24* (2006.01)
*G01R 31/396* (2019.01)
*H02J 7/00* (2006.01)

(52) U.S. Cl.
CPC ............ *G06F 1/24* (2013.01); *G01R 31/396* (2019.01); *H01M 10/4285* (2013.01); *H01M 2010/4271* (2013.01); *H02J 7/0029* (2013.01); *H02J 7/0047* (2013.01)

(58) Field of Classification Search
CPC ............ G01R 31/396; H01M 10/4285; H01M 2010/4271; G06F 1/24; H02J 7/0029; H02J 7/0047
USPC .......................................................... 320/132
See application file for complete search history.

(56) References Cited

U.S. PATENT DOCUMENTS

| | | | | |
|---|---|---|---|---|
| 3,568,077 A | * | 3/1971 | Fujimoto ................... | G01S 1/30 327/236 |
| 3,701,464 A | * | 10/1972 | Crum ....................... | B41F 13/14 101/248 |
| 3,739,098 A | * | 6/1973 | Camiciottoli ........ | H04B 17/406 370/246 |
| 3,760,127 A | * | 9/1973 | Camiciottoli ........ | H04B 17/406 370/246 |

(Continued)

FOREIGN PATENT DOCUMENTS

| | | | | |
|---|---|---|---|---|
| GB | 1188096 A | * | 4/1970 | |
| GB | 1416640 A | * | 12/1975 | ........... G01N 27/223 |

(Continued)

*Primary Examiner* — John T Trischler
(74) *Attorney, Agent, or Firm* — Ray A. King; Frank D. Cimino

(57) ABSTRACT

A battery cell monitoring circuit comprises an input pin; a reset command detection circuit comprising an integrator circuit coupled to the input pin; a counter circuit coupled to an output terminal of the integrator circuit; and a one-shot circuit coupled to an output terminal of the counter circuit; a logic gate coupled to an output terminal of the one-shot circuit; and a reset circuit coupled to the logic gate.

14 Claims, 9 Drawing Sheets

(56) References Cited

U.S. PATENT DOCUMENTS

| | | | | |
|---|---|---|---|---|
| 3,840,856 A * | 10/1974 | Beall | G06K 9/00 | 382/256 |
| 3,859,475 A * | 1/1975 | Wulfsberg | H04W 88/188 | 455/431 |
| 3,940,565 A * | 2/1976 | Lindenberg | G10L 25/00 | 704/253 |
| 3,973,189 A * | 8/1976 | Angel | G01N 15/12 | 377/50 |
| 3,979,055 A * | 9/1976 | Fathauer | G01G 11/18 | 177/16 |
| 4,037,257 A * | 7/1977 | Chari | G11B 20/1419 | |
| 4,045,780 A * | 8/1977 | Kashio | B41J 21/14 | 400/279 |
| 4,068,465 A * | 1/1978 | Bacon | G04G 9/04 | 368/239 |
| 4,086,444 A * | 4/1978 | Smith | H04M 9/002 | 379/159 |
| 4,163,993 A * | 8/1979 | Ravizza | G11B 5/588 | 386/221 |
| 4,197,564 A * | 4/1980 | Ravizza | G11B 5/588 | |
| 4,214,152 A * | 7/1980 | Hess | G01D 5/39 | 377/28 |
| 4,215,362 A * | 7/1980 | Ravizza | G11B 5/588 | 386/221 |
| 4,256,100 A * | 3/1981 | Levy | A61M 16/0081 | 128/205.15 |
| 4,269,489 A * | 5/1981 | Takimoto | G01R 19/16542 | 352/174 |
| 4,294,322 A * | 10/1981 | Nishiyama | G01G 23/37 | 177/DIG. 3 |
| 4,308,560 A * | 12/1981 | Ravizza | G11B 5/588 | 386/350 |
| 4,318,142 A * | 3/1982 | Ravizza | G11B 15/1808 | |
| 4,319,289 A * | 3/1982 | Ravizza | G11B 5/588 | |
| 4,327,985 A * | 5/1982 | Urushihara | G03B 17/18 | 396/283 |
| 4,359,062 A * | 11/1982 | Uecker | G07D 1/00 | 453/40 |
| 4,380,742 A * | 4/1983 | Hart | H03L 7/085 | 331/25 |
| 4,389,111 A * | 6/1983 | Uchidoi | G03B 7/26 | 396/406 |
| 4,397,009 A * | 8/1983 | Eriksson | G11B 7/08535 | 369/30.16 |
| 4,399,468 A * | 8/1983 | Mizuno | G06K 15/10 | 358/3.1 |
| 4,421,993 A * | 12/1983 | Bloomer | H05B 39/044 | 363/79 |
| 4,453,439 A * | 6/1984 | Koike | G10H 1/00 | 984/301 |
| 4,454,499 A * | 6/1984 | Yarborough, Jr. | G11B 20/1423 | 360/41 |
| 4,494,153 A * | 1/1985 | Ravizza | G11B 5/588 | 386/221 |
| 4,508,083 A * | 4/1985 | Hasegawa | F02D 41/062 | 123/491 |
| 4,554,542 A * | 11/1985 | Dolikian | H04B 14/004 | 455/702 |
| 4,587,415 A * | 5/1986 | Tsunekawa | H04N 3/155 | 348/E3.018 |
| 4,593,371 A * | 6/1986 | Grajewski | H05G 1/46 | 250/252.1 |
| 4,660,955 A * | 4/1987 | Ishida | G02B 7/34 | 396/125 |
| 4,682,343 A * | 7/1987 | Pfiffner | H04L 27/186 | 375/376 |
| 4,709,202 A * | 11/1987 | Koenck | H02J 7/00047 | 320/152 |
| 4,755,662 A * | 7/1988 | Fujiwra | G01S 17/46 | 250/201.4 |
| 4,899,338 A * | 2/1990 | Wroblewski | H04Q 9/14 | 340/459 |
| 4,961,073 A * | 10/1990 | Drapac | H04W 52/0232 | 340/7.34 |
| 4,994,984 A * | 2/1991 | Massimo | B67D 7/303 | 700/282 |
| 5,019,843 A * | 5/1991 | Ogawa | G03B 17/24 | 396/318 |
| 5,061,950 A * | 10/1991 | Suzuki | G03B 17/425 | 396/406 |
| 5,148,380 A * | 9/1992 | Lin | G06F 1/3215 | 713/321 |
| 5,166,545 A * | 11/1992 | Harrington | G06F 1/24 | 327/143 |
| 5,212,439 A * | 5/1993 | Sano | H02J 7/007184 | 320/161 |
| 5,382,893 A * | 1/1995 | Dehnel | H02J 7/0091 | 320/160 |
| 5,396,115 A * | 3/1995 | Coffman | H03K 5/04 | 327/143 |
| 5,408,064 A * | 4/1995 | Takahara | B23H 7/16 | 323/283 |
| 5,521,485 A * | 5/1996 | Vogelsberger | H02J 7/2434 | 322/18 |
| 5,655,070 A * | 8/1997 | Suwa | G06F 1/28 | 400/54 |
| 5,710,506 A * | 1/1998 | Broell | H02J 7/0071 | 320/156 |
| 5,850,351 A * | 12/1998 | Lotfy | H02J 7/0016 | 340/636.15 |
| 6,049,210 A * | 4/2000 | Hwang | G01R 31/3648 | 324/427 |
| 6,084,450 A * | 7/2000 | Smith | H03K 7/08 | 327/172 |
| 6,294,905 B1 * | 9/2001 | Schwartz | H01H 47/325 | 323/288 |
| 6,307,480 B1 * | 10/2001 | Sheldon | G06F 1/30 | 327/143 |
| 6,340,876 B1 * | 1/2002 | Saint-Pierre | H02J 7/0047 | 320/DIG. 12 |
| 6,646,561 B1 * | 11/2003 | Zur | G01R 31/3647 | 324/435 |
| 6,748,457 B2 * | 6/2004 | Fallon | G06F 9/4401 | 711/112 |
| 6,992,463 B2 * | 1/2006 | Yoshio | H02J 7/00308 | 320/136 |
| 7,075,802 B2 * | 7/2006 | Yamashita | H02M 3/33523 | 363/21.16 |
| 7,133,483 B1 * | 11/2006 | Kramer | H03K 5/135 | 375/354 |
| 7,181,608 B2 * | 2/2007 | Fallon | G06F 3/0638 | 713/1 |
| 7,248,020 B2 * | 7/2007 | Hidaka | H02J 7/0013 | 320/136 |
| 7,423,410 B2 * | 9/2008 | Yoshio | H02J 7/007182 | 320/136 |
| 7,486,050 B2 * | 2/2009 | Hidaka | H02J 7/0013 | 320/134 |
| 8,090,936 B2 * | 1/2012 | Fallon | G06F 3/0613 | 713/1 |
| 8,112,619 B2 * | 2/2012 | Fallon | G06F 3/0638 | 713/1 |
| 8,232,771 B2 * | 7/2012 | Johnson | G01R 31/3842 | 320/132 |
| 8,442,586 B2 * | 5/2013 | Danis | H04B 1/3816 | 320/132 |
| 8,462,005 B2 * | 6/2013 | Kuroda | H02J 7/0021 | 307/9.1 |
| 8,638,574 B2 * | 1/2014 | Sugawara | H02M 3/33523 | 363/21.13 |
| 8,736,229 B2 * | 5/2014 | Kawahara | H02J 7/0016 | 320/116 |
| 8,754,612 B2 * | 6/2014 | Johnson | G01R 31/3842 | 320/132 |
| 8,880,862 B2 * | 11/2014 | Fallon | G06F 9/4401 | 713/1 |

(56) References Cited

U.S. PATENT DOCUMENTS

| | | | |
|---|---|---|---|
| 8,890,588 B2* | 11/2014 | Shah | G06F 1/24 327/143 |
| 9,172,120 B2* | 10/2015 | Pariseau | H02J 7/0029 |
| 9,231,280 B2* | 1/2016 | Komatsu | H01M 10/4207 |
| 9,401,634 B2* | 7/2016 | Gaknoki | H02M 1/40 |
| 9,728,821 B2* | 8/2017 | Komatsu | B60L 50/64 |
| 9,792,128 B2* | 10/2017 | Fallon | G06F 3/0613 |
| 10,256,513 B2* | 4/2019 | Sakabe | H02J 7/0047 |
| 10,608,456 B2* | 3/2020 | Hunter | H02J 7/00306 |
| 10,623,013 B1* | 4/2020 | Ravinuthula | G01R 31/396 |
| 10,679,016 B2* | 6/2020 | Ni | G06F 40/58 |
| 10,741,888 B2* | 8/2020 | Martin | H02J 13/0003 |
| 10,855,307 B2* | 12/2020 | Ravinuthula | H03M 3/458 |
| 11,018,517 B2* | 5/2021 | Hunter | G01R 35/00 |
| 11,119,557 B2* | 9/2021 | El Markhi | G06F 1/24 |
| 2001/0047473 A1* | 11/2001 | Fallon | G06F 9/445 713/2 |
| 2001/0052038 A1* | 12/2001 | Fallon | G06F 3/0613 710/22 |
| 2002/0069354 A1* | 6/2002 | Fallon | G06F 9/4406 713/2 |
| 2003/0115001 A1* | 6/2003 | Odaohhara | G06F 11/0793 714/E11.138 |
| 2005/0002305 A1* | 1/2005 | Buehler | G11B 7/0053 369/124.05 |
| 2005/0219776 A1* | 10/2005 | Yamashita | H02M 3/33523 361/18 |
| 2006/0012337 A1* | 1/2006 | Hidaka | G01R 19/16542 320/119 |
| 2006/0113980 A1* | 6/2006 | Yoshida | H02M 3/1588 323/282 |
| 2006/0255768 A1* | 11/2006 | Yoshio | H02J 7/0072 320/134 |
| 2007/0043939 A1* | 2/2007 | Fallon | G06F 3/0676 713/2 |
| 2007/0083746 A1* | 4/2007 | Fallon | G06F 9/445 713/1 |
| 2007/0145951 A1* | 6/2007 | Hidaka | H02J 7/0021 320/134 |
| 2007/0217559 A1* | 9/2007 | Stott | H04L 7/0337 375/355 |
| 2007/0262750 A1* | 11/2007 | Yun | G01R 31/374 320/132 |
| 2008/0136399 A1* | 6/2008 | Alfano | G01R 19/0092 324/98 |
| 2009/0033317 A1* | 2/2009 | Hayashi | G01B 7/003 324/207.21 |
| 2009/0085516 A1* | 4/2009 | Emori | B60L 58/26 340/455 |
| 2009/0087722 A1* | 4/2009 | Sakabe | B60L 11/1879 429/61 |
| 2009/0168928 A1* | 7/2009 | Exeter | H04L 25/063 375/343 |
| 2010/0146318 A1* | 6/2010 | Johnson | G01R 31/3842 713/340 |
| 2010/0226495 A1* | 9/2010 | Kelly | G11B 20/0021 380/28 |
| 2011/0075712 A1* | 3/2011 | Kuroda | G01R 31/396 429/90 |
| 2011/0231642 A1* | 9/2011 | Fallon | G06F 3/0613 713/2 |
| 2011/0289248 A1* | 11/2011 | Djabbari | G06F 13/4256 710/110 |
| 2012/0013201 A1* | 1/2012 | Pariseau | H01M 10/48 307/125 |
| 2012/0025769 A1* | 2/2012 | Kikuchi | B60L 11/1853 320/118 |
| 2012/0106208 A1* | 5/2012 | Sugawara | H02M 3/33523 363/21.13 |
| 2012/0133370 A1* | 5/2012 | Kubo | H02J 7/00309 324/433 |
| 2012/0175953 A1* | 7/2012 | Ohkawa | H01M 10/441 307/18 |
| 2012/0212356 A1* | 8/2012 | Killat | H03M 1/125 341/110 |
| 2012/0239921 A1* | 9/2012 | Fallon | G06F 3/0613 713/2 |
| 2012/0275101 A1* | 11/2012 | Johnson | G01R 31/3842 324/426 |
| 2012/0280661 A1* | 11/2012 | Nam | H02J 7/0029 320/136 |
| 2012/0313716 A1* | 12/2012 | Audy | H03K 4/08 331/55 |
| 2012/0314504 A1* | 12/2012 | Komai | G11C 16/3454 365/185.22 |
| 2013/0059182 A1* | 3/2013 | Komatsu | B60L 58/22 429/93 |
| 2013/0236203 A1* | 9/2013 | Nakajima | G03G 15/80 399/88 |
| 2014/0159671 A1* | 6/2014 | Kawahara | B60L 58/14 320/134 |
| 2015/0035477 A1* | 2/2015 | Wong | H02J 7/0068 320/165 |
| 2015/0256151 A1* | 9/2015 | Sharma | H03H 11/1291 341/172 |
| 2015/0268969 A1* | 9/2015 | Fallon | G06F 3/0613 713/2 |
| 2015/0343978 A1* | 12/2015 | List | B60R 21/0173 307/64 |
| 2015/0358147 A1* | 12/2015 | Mactaggart | H03L 7/095 375/374 |
| 2016/0172721 A1* | 6/2016 | Komatsu | H01M 10/4207 429/90 |
| 2016/0241054 A1* | 8/2016 | Matsumoto | H01M 10/441 |
| 2016/0254683 A1* | 9/2016 | Matsumoto | B60L 58/22 320/118 |
| 2017/0149101 A1* | 5/2017 | Sakabe | H02J 7/0047 |
| 2018/0062383 A1* | 3/2018 | Kawashima | H02M 1/32 |
| 2018/0143840 A1* | 5/2018 | Fallon | G06F 3/0658 |
| 2018/0254652 A1* | 9/2018 | Hunter | H02J 7/00 |
| 2018/0352639 A1* | 12/2018 | Carreau | H05G 1/10 |
| 2019/0006723 A1* | 1/2019 | Martin | H02J 13/0003 |
| 2020/0136642 A1* | 4/2020 | Ravinuthula | H03M 3/458 |
| 2020/0195034 A1* | 6/2020 | Hunter | G01R 35/00 |
| 2020/0204191 A1* | 6/2020 | Ravinuthula | H03M 3/466 |
| 2021/0278474 A1* | 9/2021 | Ravinuthula | H02J 7/0025 |

FOREIGN PATENT DOCUMENTS

| | | |
|---|---|---|
| JP | 04026269 A * | 1/1992 |
| JP | H067175 B2 * | 1/1994 |

* cited by examiner

RESET CIRCUIT FOR BATTERY MANAGEMENT SYSTEM

CROSS-REFERENCE TO RELATED APPLICATIONS

The present application claims priority to U.S. Provisional Patent Application No. 62/855,570, which was filed May 31, 2019, is titled "System Lockup Prevention Scheme For Automotive Battery Voltage Monitors," and is hereby incorporated herein by reference in its entirety.

BACKGROUND

Various electronic devices (e.g., electric vehicles, smartphones) are powered by rechargeable batteries. The rechargeable batteries may include one or more battery cells. To provide reliable operations of a rechargeable battery, a battery management system (BMS) monitors a status indicator (e.g., voltage, temperature, load balance, fault mode) of the rechargeable battery. The BMS may include one or more battery cell monitoring circuits. A battery cell monitoring circuit may be configured to monitor the status indicator of one or more battery cells of a rechargeable battery. A battery cell monitoring circuit may also be referred to as a cell monitor control (CMC) or a cell monitor unit (CMU). By monitoring the status indicator, the BMS ensures that the rechargeable battery is operating within safe parameters. If the BMS determines the rechargeable battery is not operating within safe parameters or loses communication with a battery cell monitoring circuit, then the BMS performs actions to protect the rechargeable battery.

SUMMARY

In some examples, a battery cell monitoring circuit comprises an input pin and a reset command detection circuit comprising an integrator circuit coupled to the input pin; a counter circuit coupled to an output terminal of the integrator circuit; and a one-shot circuit coupled to an output terminal of the counter circuit. The battery cell monitoring circuit further comprises a logic gate coupled to an output terminal of the one-shot circuit and a reset circuit coupled to the logic gate.

In other examples, a battery management system comprises a battery cell and a battery cell monitoring circuit coupled to the battery cell, the battery cell monitoring circuit to monitor a status of the battery cell. The battery cell monitoring circuit comprises an integrator circuit configured to generate an integrated signal based on a first signal; a counter circuit coupled to the integrator circuit, the counter circuit to indicate whether the first signal is a reset command based on a number of pulses of the integrated signal; a one-shot circuit coupled to the counter circuit, the one-shot circuit configured to generate a second signal based on an indication that the first signal is a reset command; and a reset circuit coupled to the one-shot circuit, the reset circuit configured to cycle a voltage regulator of the battery cell monitoring circuit in response to the second signal.

In yet other examples, a battery cell monitoring circuit, comprises a first reset command detection circuit adapted to couple to another battery cell monitoring circuit, the first reset command detection circuit comprising a first integrator circuit, a first counter circuit coupled to the first integrator circuit, and a first one-shot circuit coupled to the first counter circuit; a second reset command detection circuit adapted to couple to a different battery cell monitoring circuit, the second reset command detection circuit comprising a second integrator circuit, a second counter circuit coupled to the second integrator circuit, and a second one-shot circuit coupled to the second counter circuit; a logic gate configured to receive a first signal from the first reset command detection circuit and a second signal from the second reset command detection circuit; and a reset circuit coupled to an output terminal of the logic gate, the reset circuit adapted to couple to a voltage regulator of the battery cell monitoring circuit.

In yet further examples, a method comprises generating, by an integrator circuit, an integrated signal based on a command signal; determining, by a counter circuit, whether the command signal is a reset command based on a number of pulses of the integrated signal; and in response to determining that the command signal is the reset command: generating, by the counter circuit, an indication that the command signal is the reset command; generating, by a one-shot circuit, a signal based on the indication; and cycling, by a reset circuit, a voltage regulator of a battery cell monitoring circuit based on the signal.

BRIEF DESCRIPTION OF THE DRAWINGS

For a detailed description of various examples, reference will now be made to the accompanying drawings in which.

DETAILED DESCRIPTION

Figure 1:
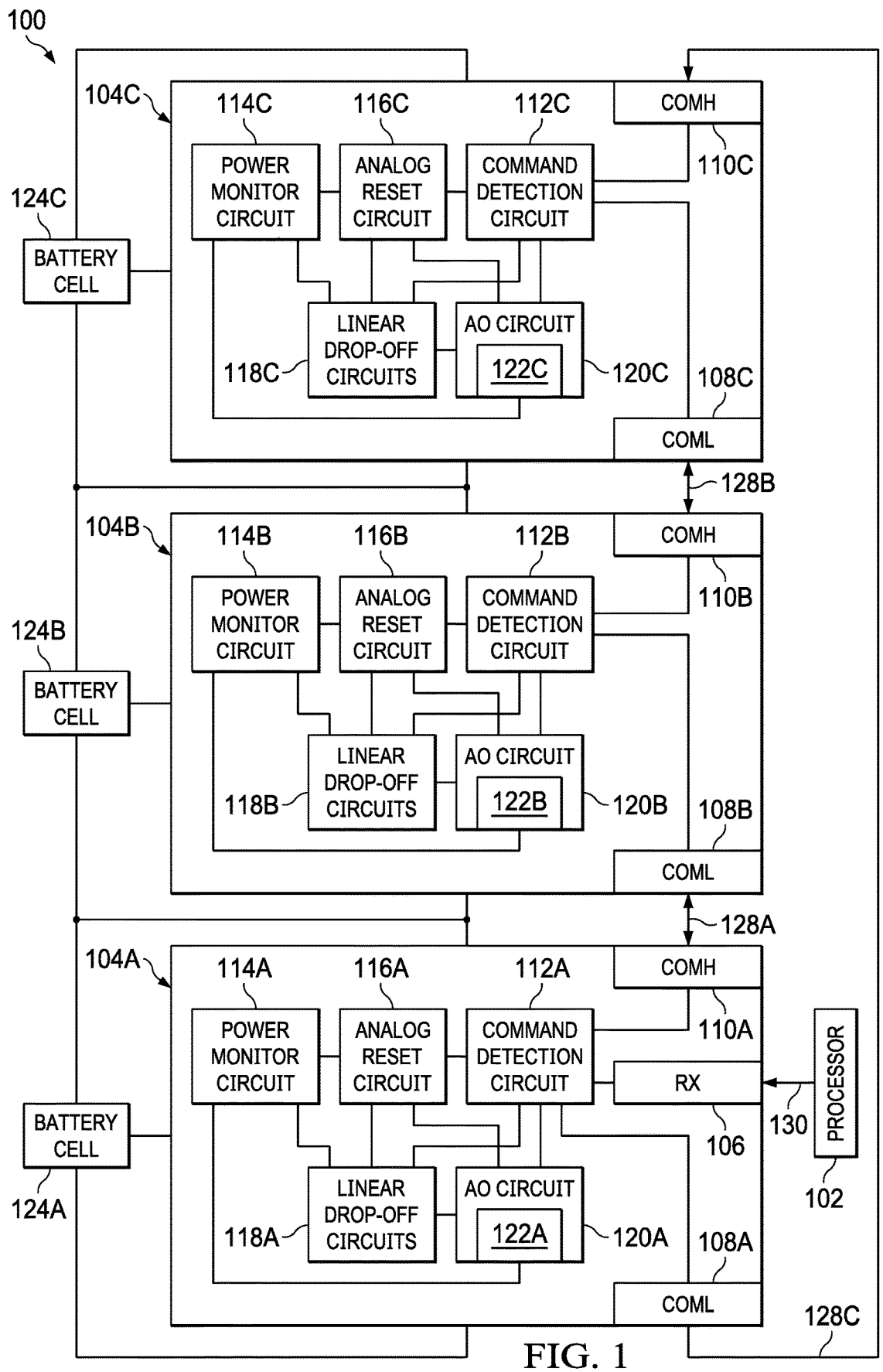
FIG. 1 depicts a schematic diagram of battery cell monitoring circuits of a battery management system in accordance with various examples.

As described above, a battery management system (BMS) includes circuitry to monitor a status indicator of a rechargeable battery of an electronic device, and if the BMS determines the battery cell monitoring circuit or the rechargeable battery is in an unsafe state, then the BMS may take actions to protect the electronic device housing the rechargeable battery, such as disabling the rechargeable battery. An unsafe state may include the battery cell monitoring circuit entering an unknown state or losing communication with the BMS. In an unknown state, the battery cell monitoring circuit may send incorrect responses to a command from the BMS. In a lost communication state, the battery cell monitoring circuit may fail to respond to a command of the BMS within an expected time period. When the BMS is unable to determine a state of the battery cell monitoring circuit or the battery cell monitoring circuit is unresponsive, a state of the battery cell monitoring circuit may be referred to as "locked up" or as in a "locked" state.

In response to a lock up, the BMS may place the rechargeable battery in a safe mode. The safe mode prevents the rechargeable battery from operating. To exit the safe mode, the rechargeable battery may be disconnected from the BMS to perform a reset. The reset cycles, or removes and then restores, a power supply of the battery cell monitoring circuit. When the power is restored, the battery cell monitoring circuit returns to operating correctly. Because the rechargeable battery supplies power to the battery cell monitoring circuit, the reset is performed by disconnecting the rechargeable battery from the BMS. In some instances, to perform the disconnection, the electronic device housing the rechargeable battery is disassembled. Specialized equipment and facilities as well as personnel trained in related safety procedures are used to perform the disassembly. Disassembly is expensive, tedious, and time-consuming and prevents a user from accessing or using the electronic device. As a result, a reputation of a manufacturer or a distributor of the electronic device may be damaged.

Accordingly, described herein are various examples of a command detection circuit that enables a BMS to perform a reset without disassembling the electronic device thereby reducing costs and increasing efficiency of repairs and reducing the time of unavailability of the electronic device to the user. Implementing the command detection circuit in this disclosure enables the BMS to send a reset command to a locked up battery cell monitoring circuit. The reset command cycles a power of the locked up battery cell monitoring circuit such as occurs when the rechargeable battery is disconnected from the battery cell monitoring unit. The cycling of power results in a dissipation of residual voltages that might be providing power to locked up components of the battery cell monitoring circuit. A voltage regulator supplies a voltage to the circuitry that processes a command to cycle so that the circuitry that processes the reset command continues to operate during a lock up of the battery cell monitoring circuit and is thus able to detect the reset command and perform a reset of the locked up battery cell monitoring circuit. Additionally, a power monitor circuit monitors the voltage supplied by the voltage regulator to the circuitry that processes the reset command to ensure the circuitry is operating within operational parameters. If the power monitor circuit detects that the circuitry that processes the reset command is not operating within operational parameters, then a reset of the battery cell monitoring circuit is performed. Illustrative battery cell monitoring circuits containing command detection circuits having circuitry that processes a reset command are now described in detail with respect to the drawings.

FIG. 1 depicts a schematic diagram of battery cell monitoring circuits 104A, 104B, and 104C of a battery management system 100 in accordance with various examples. The following paragraphs describe examples of command detection circuits 112A, 112B, 112C that are included in the battery cell monitoring circuits 104A, 104B, 104C, respectively. The specific technical advantages produced by battery management systems including these command detection circuits—e.g., ability to perform a reset without specialized tools, facilities, procedures, and personnel—are also described.

In some examples, the battery management system 100 includes battery cells 124A, 124B, and 124C; battery cell monitoring circuits 104A, 104B, and 104C; and a processor 102. The processor 102 may be a microcontroller unit (MCU), a microprocessor, a controller, or a microcontroller, for example. The battery cell 124A couples to the battery cell monitoring circuits 104A, 104B and to the battery cell 124B. The battery cell 124B couples to the battery cell monitoring circuits 104A, 104B, 104C and to the battery cells 124A, 124B. The battery cell 124C couples to the battery cell monitoring circuits 104B, 104C and to the battery cell 124B. As discussed above, in various examples, multiple battery cells may be coupled to a battery cell monitoring circuit. For example, battery cell monitoring circuit 104A, 104B, 104C may each be configured to monitor status indicators for a different group of sixteen battery cells. The battery cell monitoring circuit 104A couples to the processor 102. In some examples, because the battery cell monitoring circuit 104A couples to the processor 102, the battery cell monitoring circuit 104A is referred to as a base device or a base unit while the battery cell monitoring circuits 1046, 104C are referred to as stack devices or stack units.

In further examples, the battery cell monitoring circuits 104A, 104B, 104C include COMH ports 110A, 1106, 110C, respectively; COML ports 108A, 108B, 108C, respectively; command detection circuits 112A, 112B, 112C, respectively; analog reset circuits 116A, 116B, 116C, respectively; power monitor circuits 114A, 114B, 114C, respectively; linear drop-off (LDO) circuits 118A, 1186, 118C, respectively; always on (AO) circuits 120A, 120B, 120C, respectively; and bandgap circuits 122A, 122B, 122C, respectively. The battery cell monitoring circuit 104A includes RX port 106. In some examples, because the RX port 106, the COML ports 108A, 108B, 108C, and the COMH ports 110A, 1106, 110C receive signals, the RX port 106, the COML ports 108A, 1086, 108C, and the COMH ports 110A, 1106, 110C are referred to as input pins or input terminals. The RX port 106 couples to the processor 102 and to the command detection circuit 112A. In further examples, the RX port 106 is referred to as a serial port because the RX port 106 receives serial communications from the processor 102.

The RX port 106, the COMH ports 110A, 1106, 110C, and the COML ports 108A, 108B, 108C couple to the command detection circuits 112A, 112B, 112C, respectively. The command detection circuits 112A, 112B, 112C couple to the analog reset circuits 116A, 116B, 116C, respectively; the LDO circuits 118A, 118B, 118C, respectively; and the AO circuits 120A, 120B, 120C, respectively. Illustrative details regarding contents of the command detection circuits 112A, 1126, 112C are provided below with respect to FIGS. 2, 3, 5, and 7.

The analog reset circuits 116A, 116B, 116C couple to the command detection circuit 112A, 112B, 112C, respectively; the power monitor circuits 114A, 114B, 114C, respectively; the LDO circuits 118A, 1186, 118C, respectively; and the AO circuits 120A, 120B, 120C, respectively. Illustrative details regarding contents of the analog reset circuits 116A, 116B, 116C are provided below with respect to FIG. 6. The power monitor circuits 114A, 114B, 114C couple to the analog reset circuit 116A, 116B, 116C, respectively; the LDO circuits 118A, 1186, 118C, respectively; and the AO circuits 120A, 120B, 120C, respectively. Illustrative details regarding contents of the power monitor circuits 114A, 114B, 114C are provided below with respect to FIG. 4.

The LDO circuits 118A, 118B, 118C couple to the command detection circuit 112A, 112B, 112C, respectively; the power monitor circuit 114A, 114B, 114C, respectively; the analog reset circuit 116A, 1166, 116C, respectively; and the AO circuits 120A, 120B, 120C, respectively. The LDO circuits regulate a voltage supplied by the battery cells 124A, 124B, 124C, respectively, and provide the regulated voltage to components of the battery cell monitoring circuits 104A, 104B, 104C. In some examples, the LDO circuits may be referred to as low dropout regulators. While in some examples, LDO circuits 118A, 118B, 118C are described, any suitable type of linear voltage regulator circuit providing stable power may be utilized.

The AO circuits 120A, 120B, 120C couple to the command detection circuit 112A, 112B, 112C, respectively; the power monitor circuit 114A, 114B, 114C, respectively; the analog reset circuit 116A, 116B, 116C, respectively; and the LDO circuits 118A, 118B, 118C, respectively. The AO circuits 120A, 120B, 120C are analog circuits that are "always on," or continually receiving a voltage supply to enable the battery cell monitoring circuits 104A, 104B, 104C, respectively, to respond to commands while the battery cell monitoring circuit 104A, 104B, 104C, respectively, is in a low-power state. The AO circuits 120A, 120B, 120C may be any suitable type of circuit to provide voltage and current bias for the power monitor circuits 114A, 114B, 114C, respectively, and the analog reset circuits 116A, 116B, 116C, respectively. The AO circuits 120A, 120B, 120C include bandgap circuits 122A, 122B, 122C. The bandgap circuits 122A, 122B, 122C are temperature independent voltage reference circuits that provide a fixed voltage to the circuitry utilized during a reset. During the reset, a voltage supply of the bandgap circuits 122A, 122B, 122C is not cycled.

The battery management system 100 includes multiple buses, including a bus 130 (which carries a signal RX) and buses 128A, 128B, 128C. The buses carry communication signals that allow for data transfers between components of the battery management system 100, for example. The bus 130 couples to the processor 102 and to the RX port 106. The signal RX is a signal propagated from the processor 102 to the battery cell monitoring circuit 104A. In some examples, the signal RX is referred to as a serial communication or serial signal. The bus 128A couples to the COMH port 110A of the battery cell monitoring circuit 104A and the COML port 108B of the battery cell monitoring circuit 104B. The bus 128B couples to the COMH port 1108 of the battery cell monitoring circuit 104B and the COML port 108C of the battery cell monitoring circuit 104C. The bus 128C couples to the COMH port 110C of the battery cell monitoring circuit 104C and the COML port 108A of the battery cell monitoring circuit 104A.

In further examples, the battery management system 100 may include fewer or more battery cell monitoring circuits and fewer or more battery cells. In some examples, a COML port of an additional battery cell monitoring circuit couples to a COMH port of an adjacent battery cell monitoring circuit and a COMH port of the additional battery cell monitoring circuit couples to a COML port of another adjacent battery cell monitoring circuit. For example, the battery management system 100 may include an additional battery cell monitoring circuit 104D configured to couple to a battery cell 124D, to the battery cell 124C, to the battery cell monitoring circuit 104C via the bus 128C (e.g., a COML port 108D of the battery cell monitoring circuit 104D couples to the COMH port 110C), and to the battery cell monitoring circuit 104A via a bus 128D (e.g., a COMH port 110D of the battery cell monitoring circuit 104D couples to the COML port 108A). In another example, in which the battery management system 100 includes two battery cell monitoring circuits such as presented below with respect to FIG. 11, the COML port and the COMH port of a battery cell monitoring circuit couple to the alternate ports of the other battery cell monitoring circuit. For example, the battery management system 100 may include battery cell monitoring circuits 104A, 104B, where the COMH port 110A couples to the COML port 108B via the bus 128A and the COMH port 1106 couples to the COML port 108A via the bus 128B.

The signals on the buses 128A, 128B, 128C are signals propagated from one battery cell monitoring circuit to another battery cell monitoring circuit. In some examples, the communications signals may be propagated in a bi-directional manner along the buses 128A, 128B, 128C. For example, a signal may propagate from the battery cell monitoring circuit 104C to the battery cell monitoring circuit 104B along the bus 128B or from the battery cell monitoring circuit 104B to the battery cell monitoring circuit 104C along the bus 128B. In further examples, the signals may be referred to by a name of the receiving port. For example, if a signal on the bus 128B is received by the COML port 108C, the signal is referred to as a COML signal. In another example, when the signal on the bus 128A is received by the COMH port 110A, the signal is referred to as a COMH signal. In yet another example, because a signal on the bus 130 is received by the RX port 106, the signal is referred to as an RX signal or a serial signal.

In further examples, the signals on the buses 128A, 128B, 128C, 130 may carry commands to the battery cell monitoring circuits 104A, 104B, 104C. A command instructs a targeted battery cell monitoring circuit to perform an action (e.g., reset, wake, sleep to active, shutdown, fault, heartbeat). For example, a signal propagated along the bus 128B may command the receiving battery cell monitoring circuit 104C to perform a reset, as described below with respect to FIG. 3. In another example, a signal propagated along the bus 128A may command the battery cell monitoring circuit 104B to wake, as described below with respect to FIG. 5. In yet another example, a signal propagated along the bus 130 may command the battery cell monitoring circuit 104A to perform a reset, as described below with respect to FIG. 7. In some examples, the signals may be referred to by the action performed (e.g., reset command signal, wake command signal, sleep to active command signal, shutdown command signal, fault command signal, heartbeat command signal).

The operation of the battery management system 100 is now described. The processor 102 transmits a signal to the battery cell monitoring circuit 104A on the bus 130. The battery cell monitoring circuit 104A receives the signal via the RX port 106. If the command detection circuit 112A determines the signal is for another battery cell monitoring circuit, then the battery cell monitoring circuit 104A propagates the signal to an adjacent battery cell monitoring circuit. For example, if the command detection circuit 112A determines the signal is not for the battery cell monitoring circuit 104A, then the battery cell monitoring circuit 104A propagates the signal along the bus 128A to the battery cell monitoring circuit 104B. The signal propagates from battery cell monitoring circuit to battery cell monitoring circuit until the targeted battery cell monitoring circuit receives the signal. An illustrative example of a targeted battery cell monitoring circuit 104A processing a signal received via the COML port 108A or the COMH port 110A is described below with respect to FIG. 5.

In further examples, the processor 102 determines a battery cell monitoring circuit is in an unknown state or is unable to communicate. For example, the processor 102 may not receive (via a transmit bus not shown), within a specified time frame, a response to a command sent to a targeted battery cell monitoring circuit. The processor 102 transmits a reset command signal for the locked up battery cell monitoring circuit. In some examples, the processor 102 may determine multiple battery cell monitoring circuits are locked up. The processor 102 transmits a reset command signal for each locked up battery cell monitoring circuit in a sequential manner. If the processor 102 determines the base device (e.g., the battery cell monitoring circuit 104A) is one of the multiple locked up battery cell monitoring circuits, then the processor 102 sends a reset command signal to the base device first. For example, if the processor 102 determines the battery cell monitoring circuits 104A and 104B are locked up, the processor 102 transmits a reset command signal to the battery cell monitoring circuit 104A. The processor 102 transmits another signal to the battery cell monitoring circuit 104A to ensure the unit is responding. If the battery cell monitoring circuit 104A is responding, then the processor 102 transmits a reset command signal for the battery cell monitoring circuit 1046 through the battery cell monitoring circuit 104A. In another example, if the processor 102 determines the battery cell monitoring circuits 104B and 104C are locked up, the processor 102 may send, through the battery cell monitoring circuit 104A, a signal for resetting the battery cell monitoring circuit 104C and then another signal for resetting the battery cell monitoring circuit 1046. An illustrative example of the battery cell monitoring circuit 104A processing a reset command signal received via the COMH port 110A or the COML port 108A is discussed below with respect to FIG. 3. An illustrative example of the battery cell monitoring circuit 104A processing a reset command signal received via the RX port 106 is described below with respect to FIG. 7.

Figure 2:
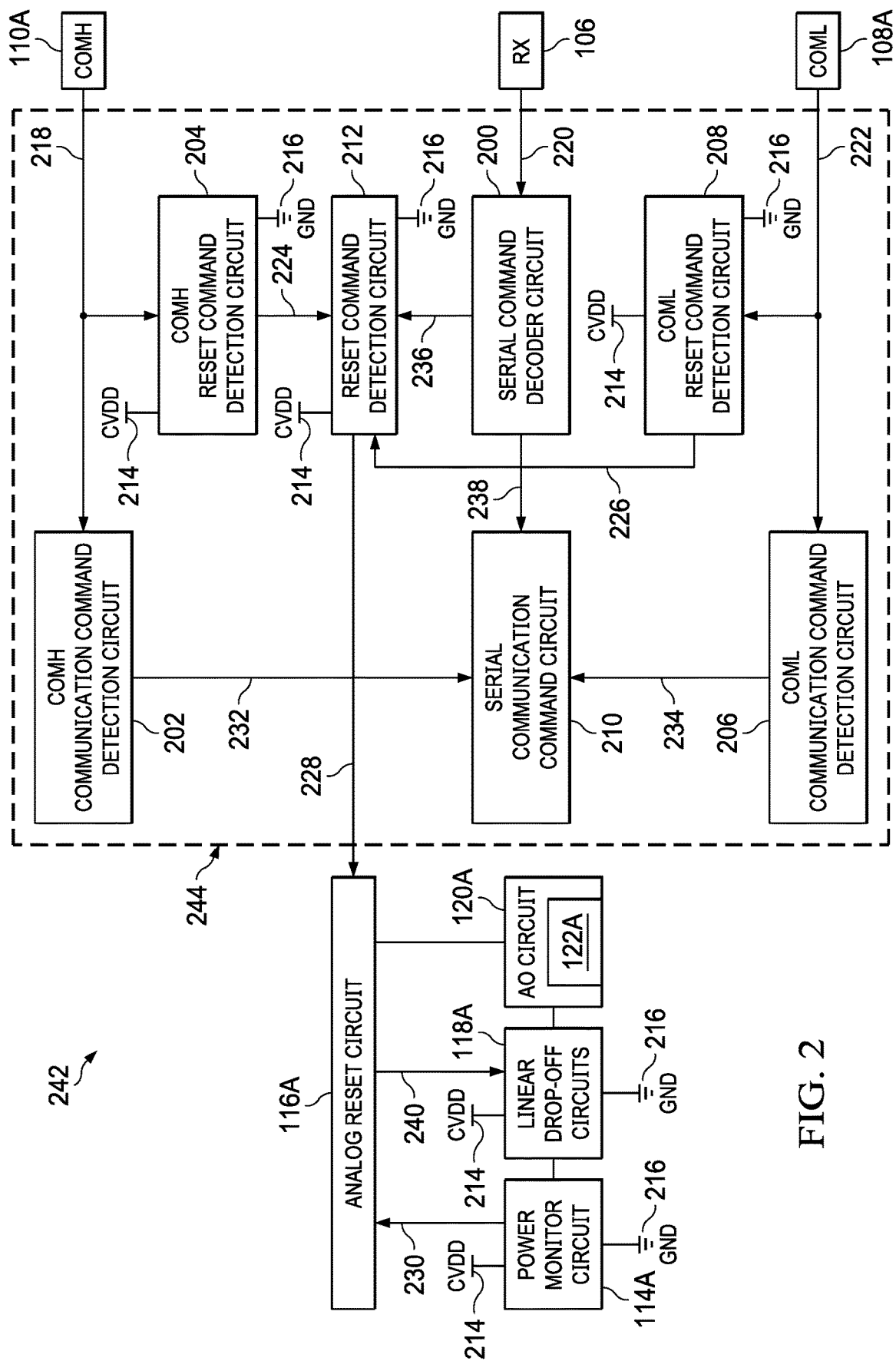
FIG. 2 depicts a schematic diagram of a command detection circuit of a battery cell monitoring circuit in accordance with various examples.

FIG. 2 depicts a schematic diagram of the command detection circuit 244 of the battery cell monitoring circuit 242, in accordance with various examples. The command detection circuit 244 may be the command detection circuit 112A, 112B, or 112C (FIG. 1) for example. The battery cell monitoring circuit 242 may be the battery cell monitoring circuit 104A, 104B, or 104C (FIG. 1), for example. In some examples, the command detection circuit 244 includes a COMH communication command detection circuit 202, a COMH reset command detection circuit 204, a reset command detection circuit 212, a serial command decoder circuit 200, a serial communication command circuit 210, a COML reset command detection circuit 208, and a COML communication command detection circuit 206. Illustrative details regarding the contents of the COMH reset command detection circuit 204, the COML reset command detection circuit 208, and the reset command detection circuit 212 are discussed below with respect to FIG. 3. Illustrative details regarding the contents of the COMH communication command detection circuit 202, the COML communication command detection circuit 206, and the serial communication command circuit 210 are discussed below with respect to FIG. 5. Illustrative details regarding the contents of the serial command decoder circuit 200 are discussed below with respect to FIG. 7.

The COMH reset command detection circuit 204 couples to the COMH port 110A, the COMH communication command detection circuit 202, and the reset command detection circuit 212. The COMH communication command detection circuit 202 couples to the COMH port 110A, the COMH reset command detection circuit 204, and the serial communication command circuit 210. The reset command detection circuit 212 couples to the analog reset circuit 116A, the COMH reset command detection circuit 204, the serial command decoder circuit 200, and the COML reset command detection circuit 208. The COML reset command detection circuit 208 couples to the COML port 108A, the COML communication command detection circuit 206, and the reset command detection circuit 212. The COML communication command detection circuit 206 couples to the COML port 108A, the COML reset command detection circuit 208, and the serial communication command circuit 210.

The battery cell monitoring circuit 242 includes multiple buses, including a bus 214, a bus 216, a bus 218, a bus 220, a bus 222, a bus 224, a bus 226, a bus 236, a bus 238, a bus 232, a bus 234, a bus 228, a bus 230, and a bus 240. The bus 214 couples to the COMH reset command detection circuit 204, to the reset command detection circuit 212, to the COML reset command detection circuit 208, to the power monitor circuit 114A and to an LDO circuit of the LDO circuits 118A. In other examples, the bus 214 may couple to the serial command decoder circuit 200, the COMH communication command detection circuit 202, the COML communication command detection circuit 206, and the serial communication command circuit 210. An LDO circuit of the LDO circuits 118A supplies a voltage CVDD to components coupled to the bus 214. The bus 216 couples to the COMH reset command detection circuit 204, to the reset command detection circuit 212, to the COML reset command detection circuit 208, to the power monitor circuit 114A and to a common ground GND terminal. In other examples, the bus 216 couples to the serial command decoder circuit 200, the COMH communication command detection circuit 202, the COML communication command detection circuit 206, the serial communication command circuit 210, the analog reset circuit 116A, the LDO circuits 118A, and the AO circuit 120A. In some examples, the common ground GND terminal couples to a cathode of a lowest battery cell coupled to the battery cell monitoring circuit 242. The bus 218 couples to the COMH port 110A, the COMH reset command detection circuit 204, and the COMH communication command detection circuit 202. The bus 220 couples to the RX port 106 and the serial command decoder circuit 200. The bus 222 couples to the COML port 108A, the COML reset command detection circuit 208, and the COML communication command detection circuit 206. The bus 224 couples to the COMH reset command detection circuit 204 and the reset command detection circuit 212. The bus 226 couples to the COML reset command detection circuit 208 and the reset command detection circuit 212. The bus 236 couples the serial command decoder circuit 200 to the reset command detection circuit 212. The bus 238 couples the serial command decoder circuit 200 to the serial communication command circuit 210. The bus 232 couples the COMH communication command detection circuit 202 to the serial communication command circuit 210. The bus 234 couples the COML communication command detection circuit 206 to the serial communication command circuit 210. The bus 228 couples the reset command detection circuit 212 to the analog reset circuit 116A. The bus 230 couples the power monitor circuit 114A to the analog reset circuit 116A. The bus 240 couples the analog reset circuit 116A to the LDO circuits 118A. An illustrative example of the analog reset circuit 116A processing the signals received via the bus 230 and sending a signal along the bus 240 to cycle the LDO circuits 118A is described below with respect to FIG. 6.

The operation of the command detection circuit 244 is now described. As discussed above with respect to FIG. 1, the battery cell monitoring circuit 242 may receive a signal via the RX port 106. The signal propagates along the bus 220 to the serial command decoder circuit 200. In some examples, the serial command decoder circuit 200 determines the signal is not a reset command signal and propagates the signal along the bus 238 to the serial communication command circuit 210 to determine what command (e.g., wake, sleep to active, shutdown, fault, heartbeat) the battery cell monitoring circuit 242 is to perform. In other examples, the serial command decoder circuit 200 determines the signal is a reset command signal and propagates a signal along the bus 236 to the reset command detection circuit 212. An illustrative example of the serial command decoder circuit 200 processing a reset command signal is described below with respect to FIG. 7. The reset command detection circuit 212 propagates a signal along the bus 228 to the analog reset circuit 116A. An illustrative example of the analog reset circuit 116A processing the signal received via the bus 228 is described below with respect to FIG. 6.

In further examples, as discussed above with respect to FIG. 1, the battery cell monitoring circuit 242 may receive a signal via the COMH port 110A. The signal propagates along the bus 218 to the COMH communication command detection circuit 202 and to the COMH reset command detection circuit 204. In some examples, the COMH communication command detection circuit 202 determines the signal is for a command other than a reset command and propagates a signal along the bus 232 to the serial communication command circuit 210 to cause the performance of the communication command. An illustrative example of the COMH communication command detection circuit 202 processing the signal received via the bus 218 is discussed below with respect to FIG. 5. In other examples, the COMH reset command detection circuit 204 determines the signal is a reset command signal, the COMH reset command detection circuit 204 propagates a signal along the bus 224 to the reset command detection circuit 212. An illustrative example of the COMH reset command detection circuit 204 processing a reset command signal is described below with respect to FIG. 3. The reset command detection circuit 212 propagates a signal along the bus 228 to the analog reset circuit 116A. An illustrative example of the analog reset circuit 116A processing the signal received via the bus 228 sending a signal along the bus 240 to cycle the LDO circuits 118A is described below with respect to FIG. 6.

In yet further examples, as discussed above with respect to FIG. 1, the battery cell monitoring circuit 242 may receive a signal via the COML port 108A. The signal propagates along the bus 222 to the COML communication command detection circuit 206 and to the COML reset command detection circuit 208. In some examples, the COML communication command detection circuit 206 determines the signal is for a command other than a reset command and propagates a signal along the bus 234 to the serial communication command circuit 210 to cause a performance of the communication command. An illustrative example of the COML communication command detection circuit 206 processing the signal received via the bus 222 is discussed below with respect to FIG. 5. In other examples, the COML reset command detection circuit 208 determines the signal is a reset command signal and propagates a signal along the bus 226 to the reset command detection circuit 212. An illustrative example of the COML reset command detection circuit 208 processing a reset command signal is described below with respect to FIG. 3. The reset command detection circuit 212 propagates a signal along the bus 228 to the analog reset circuit 116A. An illustrative example of the analog reset circuit 116A processing the signal received via the bus 228 sending a signal along the bus 240 to cycle the LDO circuits 118A is described below with respect to FIG. 6.

Figure 3:
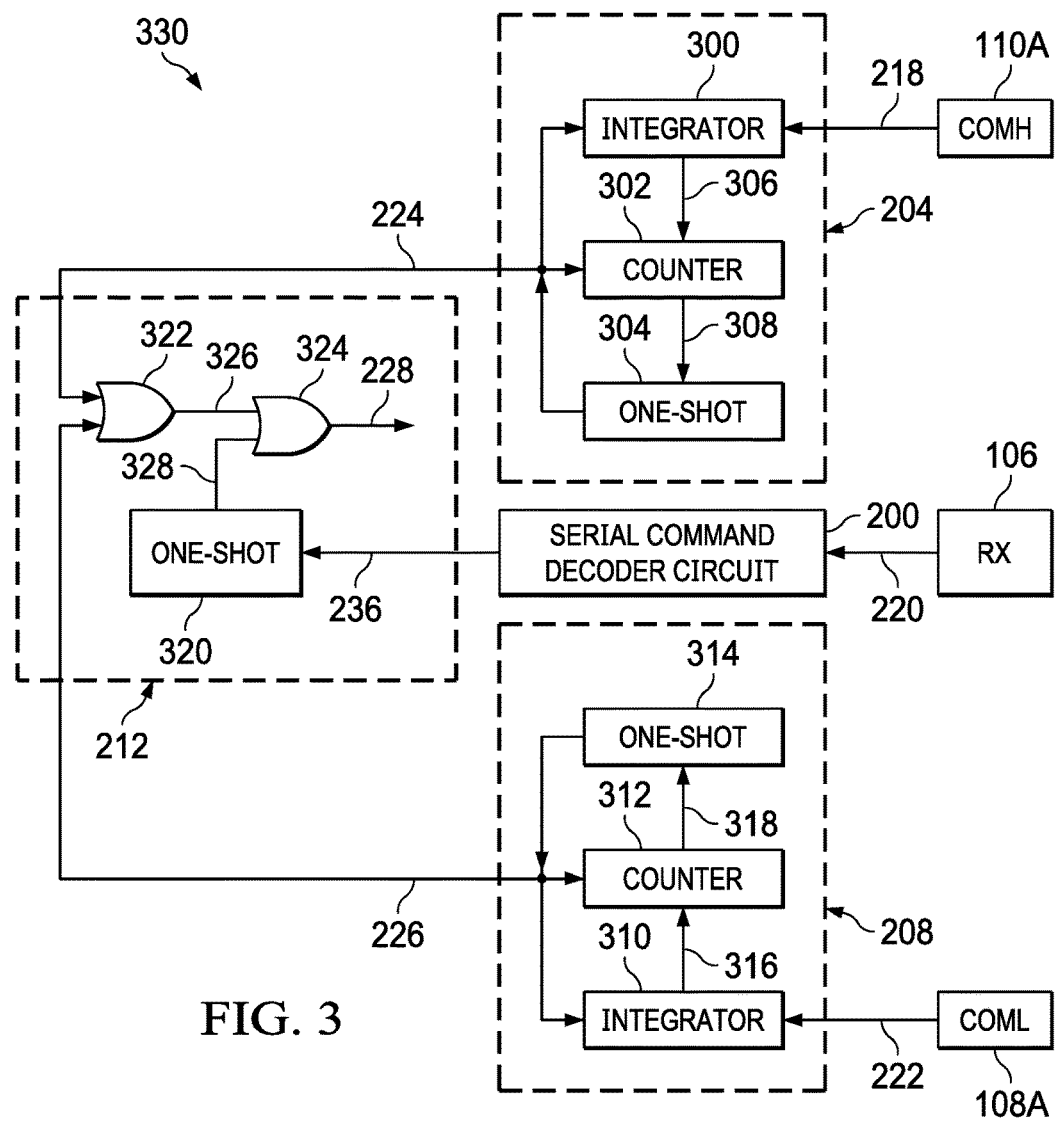
FIG. 3 depicts a schematic diagram of a reset command circuit of a command detection circuit in accordance with various examples.

FIG. 3 depicts a schematic diagram of the reset command detection circuit 212 of the command detection circuit 330 in accordance with various examples. The command detection circuit 330 may be the command detection circuit 244 (FIG. 2), for example. In some examples, as discussed above with respect to FIG. 2, the command detection circuit 330 includes the COMH reset command detection circuit 204, the COML reset command detection circuit 208, and the reset command detection circuit 212. The COMH reset command detection circuit 204 includes an integrator circuit 300, a counter circuit 302, and a one-shot circuit 304. The integrator circuit 300 couples to the COMH port 110A, the counter circuit 302, the one-shot circuit 304, and the OR gate 322. The counter circuit 302 couples to the integrator circuit 300, the one-shot circuit 304, and the OR gate 322. The one-shot circuit 304 couples to the integrator circuit 300, the counter circuit 302, and the OR gate 322. In further examples, the COML reset command detection circuit 208 includes components that similar to the components of the COMH reset command detection circuit 204. For example, the COML reset command detection circuit 208 includes an integrator circuit 310, a counter circuit 312, and a one-shot circuit 314. The redundancy of the COML reset command detection circuit 208 and the COMH reset command detection circuit 204 provides multiple buses for the processor 102 to utilize when sending communication signals to battery cell monitoring circuits (e.g., 104A (FIG. 1), 104B (FIG. 1), 104C (FIG. 1), 242 (FIG. 2). Thus, the processor 102 has multiple routes to utilize to reset a locked up battery cell monitoring circuit.

The reset command detection circuit 212 includes multiple logic gates, including OR gates 322 and 324, and a one-shot circuit 320. The OR gate 322 couples to the integrator circuits 300, 310; the counter circuits 302, 312; the one-shot circuits 304, 314; and the OR gate 324. The one-shot circuit 320 couples to the serial command decoder circuit 200 and the OR gate 324. The OR gate 324 couples to the OR gate 322 and the one-shot circuit 320. While in FIG. 3 multiple OR logic gates are included, any logic circuitry having an output signal go high when any input signal is high may be utilized instead. For example, the reset command detection circuit 212 may include a triple-input OR gate instead of the OR gates 322, 324, where the triple-input OR gate couples to the integrator circuits 300, 310; the counter circuits 302, 312; and the one-shot circuits 304, 314, 320.

The COMH reset command detection circuit 204 includes the bus 218, a bus 306, a bus 308 and the bus 224. The bus 218 couples an input terminal of the integrator circuit 300 to the COMH port 110A. The bus 224 couples an output terminal of the one-shot circuit 304 to a reset input terminal of the integrator circuit 300, to a reset input terminal of the counter circuit 302, and to an input terminal of the OR gate 322. The bus 306 couples an output terminal of the integrator circuit 300 to an input terminal of the counter circuit 302. The bus 308 couples an output terminal of the counter circuit 302 to an input terminal of the one-shot circuit 304.

The COML reset command detection circuit 208 includes the bus 222, a bus 316, a bus 318, and the bus 226. The bus 222 couples the COML port 108A to an input terminal of the integrator circuit 310. The bus 226 couples an output terminal of the one-shot circuit 314 to a reset input terminal of the counter circuit 312, to a reset input terminal of the integrator circuit 310, and to an input terminal of the OR gate 322. The bus 316 couples an output terminal of the integrator circuit 310 to an input terminal of the counter circuit 312. The bus 318 couples an output terminal of the counter circuit 312 to an input terminal of the one-shot circuit 314.

The reset command detection circuit 212 includes the bus 224, the bus 226, the bus 236, a 326, a 328, and the bus 228. As discussed above, the bus 224 couples an input terminal of the OR gate 322 to a reset input terminal of the integrator circuit 300, to a reset input terminal of the counter circuit 302, and to an output terminal of the one-shot circuit 304. As discussed above, the bus 226 couples another input terminal of the OR gate 322 to an output terminal of the one-shot circuit 314, to a reset input terminal of the counter circuit 312, and to a reset input terminal of the integrator circuit 310. The bus 236 couples an output terminal of the serial command decoder circuit 200 to an input terminal of the one-shot circuit 320. The bus 326 couples an output terminal of the OR gate 322 to an input terminal of the OR gate 324. The bus 328 couples an output terminal of the one-shot circuit 320 to another input terminal of the OR gate 324. The bus 228 couples to an output terminal of the OR gate 324 and to the analog reset circuit 116A (FIG. 2).

The operation of the reset command detection circuit 212 is now described. As discussed above with respect to FIGS. 1 and 2 above, the command detection circuit 330 may receive a signal via the COMH port 110A. The signal propagates along the bus 218 to the integrator circuit 300. The integrator circuit 300 generates an integrated signal based on the signal. For example, the integrator circuit 300 may generate an integrated signal by inverting a polarity of the signal over a frequency range based on a time constant of the integrator circuit 300 and a bandwidth of an amplifier of the integrator circuit 300. The integrated signal propagates along the bus 306 to the counter circuit 302. If a number of pulses of the integrated signal indicates the signal is a reset command signal, the output of the counter circuit 302 coupled to the input of the one-shot circuit 304 by the bus 308 switches states. For example, as discussed below with respect to FIG. 7, the counter circuit 302 may include logic circuitry. If an output of a counter integrated circuit (IC) equals a predetermined count, then an output of the logic circuitry may switch states (e.g., high to low, low to high). The switched state may enable an enable input of the one-shot circuit 304. In response to the switched state, the one-shot circuit 304 generates an output pulse. In some examples, the one-shot circuit 304 may include a monostable multivibrator or any sequential logic electronic circuitry for generating an output pulse having a pre-defined duration. For example, if the enable input of the one-shot circuit 304 is enabled then the monostable multivibrator may generate the output pulse. The output pulse propagates along the bus 224 to reset the integrator circuit 300, to reset the counter circuit 302, and to drive an output signal of the OR gate 322 high. The high output signal of the OR gate 322 propagates along the bus 326 to drive the output of the OR gate 324 high. The high output signal of the OR gate 324 propagates along the bus 228 to the analog reset circuit 116A. An illustrative example of the analog reset circuit 116A processing the high output signal received via the bus 228 is described below with respect to FIG. 6.

In yet further examples, as discussed above with respect to FIGS. 1 and 2, the command detection circuit 330 may receive a signal via the COML port 108A. The signal received via the COML port 108A propagates through the COML reset command detection circuit 208 in a manner similar to that discussed above with respect to the COMH reset command detection circuit 204. The integrator circuit 310 generates an integrated signal based on the signal. The integrated signal propagates to the counter circuit 312. If a number of pulses of the integrated signal indicates the signal is a reset command signal, an output of the counter circuit 312 switches states. In response to the switched state, the one-shot circuit 314 generates an output pulse. The output pulse propagates along the bus 226 to reset the integrator circuit 310, to reset the counter circuit 312, and to drive an output signal of the OR gate 322 high. The high output signal of the OR gate 322 drives the output of the OR gate 324 high. The high output signal of the OR gate 324 propagates along the bus 228 to the analog reset circuit 116A. An illustrative example of the analog reset circuit 116A processing the high output signal received via the bus 228 is described below with respect to FIG. 6.

Figure 4:
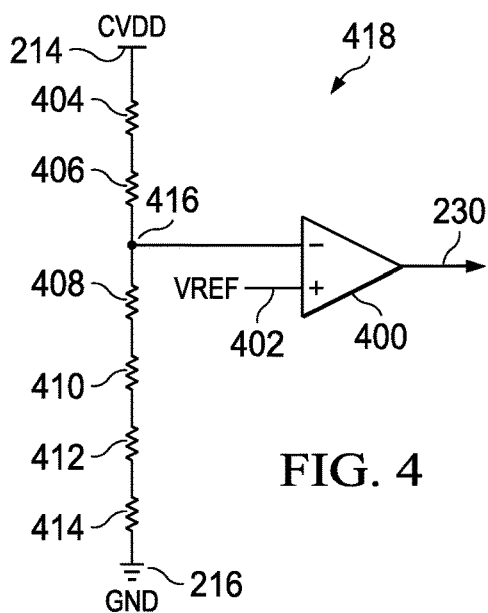
FIG. 4 depicts a schematic diagram of a power monitor circuit of a battery cell monitoring circuit in accordance with various examples.

FIG. 4 depicts a schematic diagram of the power monitor circuit 418 of a battery cell monitoring circuit in accordance with various examples. The power monitor circuit 418 may be the power monitor circuit 114A, 114B, or 114C, for example. The battery cell monitoring circuit may be the battery cell monitoring circuit 104A (FIG. 1), 104B (FIG. 1), 104C (FIG. 1), or 242 (FIG. 2) for example. The power monitor circuit 418 includes a comparator 400; resistors 404, 406, 408, 410, 412, 414; and a node 416. In some examples, the resistors 404, 406, 408, 410, 412, 414 are referred to as a voltage divider network. While the illustrated voltage divider includes six resistors, the voltage divider network may include any number of resistors. A first terminal of the resistor 404 couples to an LDO circuit of the LDO circuits 118A (FIG. 1) supplying the voltage CVDD (FIG. 2). A second terminal of the resistor 404 couples to a first terminal of the resistor 406. A second terminal of the resistor 406 couples to the node 416 and a first terminal of the resistor 408. A second terminal of the resistor 408 couples to the node 416 and to a first terminal of the resistor 410. A second terminal of the resistor 410 couples to a first terminal of the resistor 412. A second terminal of the resistor 412 couples to a first terminal of the resistor 414. A second terminal of the resistor 414 couples to the common ground GND terminal. The node 416 couples to the second terminal of the resistor 406, to the first terminal of the resistor 408 and to an inverting input terminal of the comparator 400. The comparator 400 includes any suitable type of comparator, such as an operational amplifier, for example. In some examples, a voltage supplied to power the comparator 400 is supplied by the bandgap circuit 122A. A voltage VREF is supplied to the non-inverting input of the comparator 400. The voltage VREF may be a voltage supplied by the bandgap circuit 122A (FIG. 1), for example. In some examples the voltage VREF is referred to as a reference voltage. The reference voltage is based on a predetermined threshold. For example, the predetermined threshold may be determined based on a minimum voltage to operate the reset command detection circuit 212, the COMH reset command detection circuit 204, and the COML reset command detection circuit 208.

The comparator 400 includes the bus 214 (which carries a signal having a voltage CVDD) (FIG. 2), the bus 216

(which carries a common ground signal GND) (FIG. 2), a bus 402 (which carries a signal having a voltage VREF), and the bus 230 (which carries a signal CVDD_UV_HWRESET) (FIG. 2). The bus 214 couples to the first terminal of the resistor 404 and the LDO circuit of the LDO circuits 118A (FIG. 1) that supplies the voltage CVDD. The bus 216 couples to the second terminal of the resistor 414 and the common ground GND terminal (FIG. 2). The bus 402 couples to the non-inverting input terminal of the comparator 400 and the bandgap circuit 122A that supplies the voltage VREF. The bus 230 couples to an output terminal of the comparator 400 and to the analog reset circuit 116A (FIG. 1). In some examples, the output signal of the comparator 400 may be referred to as the signal CVDD_UV_HWRESET. Illustrative details regarding the operation of the analog reset circuit 116A based on the signal CVDD-UV_HWRESET are discussed below with respect to FIG. 6.

The operation of the power monitor circuit 418 is now described. The comparator 400 compares the voltage VREF of the non-inverting input to a voltage received at the inverting input terminal. The voltage received at the inverting input terminal is the voltage at the node 416. The voltage at the node 416 is a fraction of the voltage CVDD. The fraction is determined by a ratio of the voltage divider network. Based on the comparison of the voltage VREF and the voltage received at the inverting input terminal, the comparator 400 generates a signal CVDD_UV_HWRESET as the output signal on the bus 230. Monitoring the voltage CVDD and resetting the battery cell monitoring circuit in response to an under voltage condition may prevent the battery cell monitoring circuit from entering an unknown state by enabling the cycling of the LDO circuits (e.g., 118A (FIG. 1)) as discussed below with respect to FIG. 6.

Figure 5:
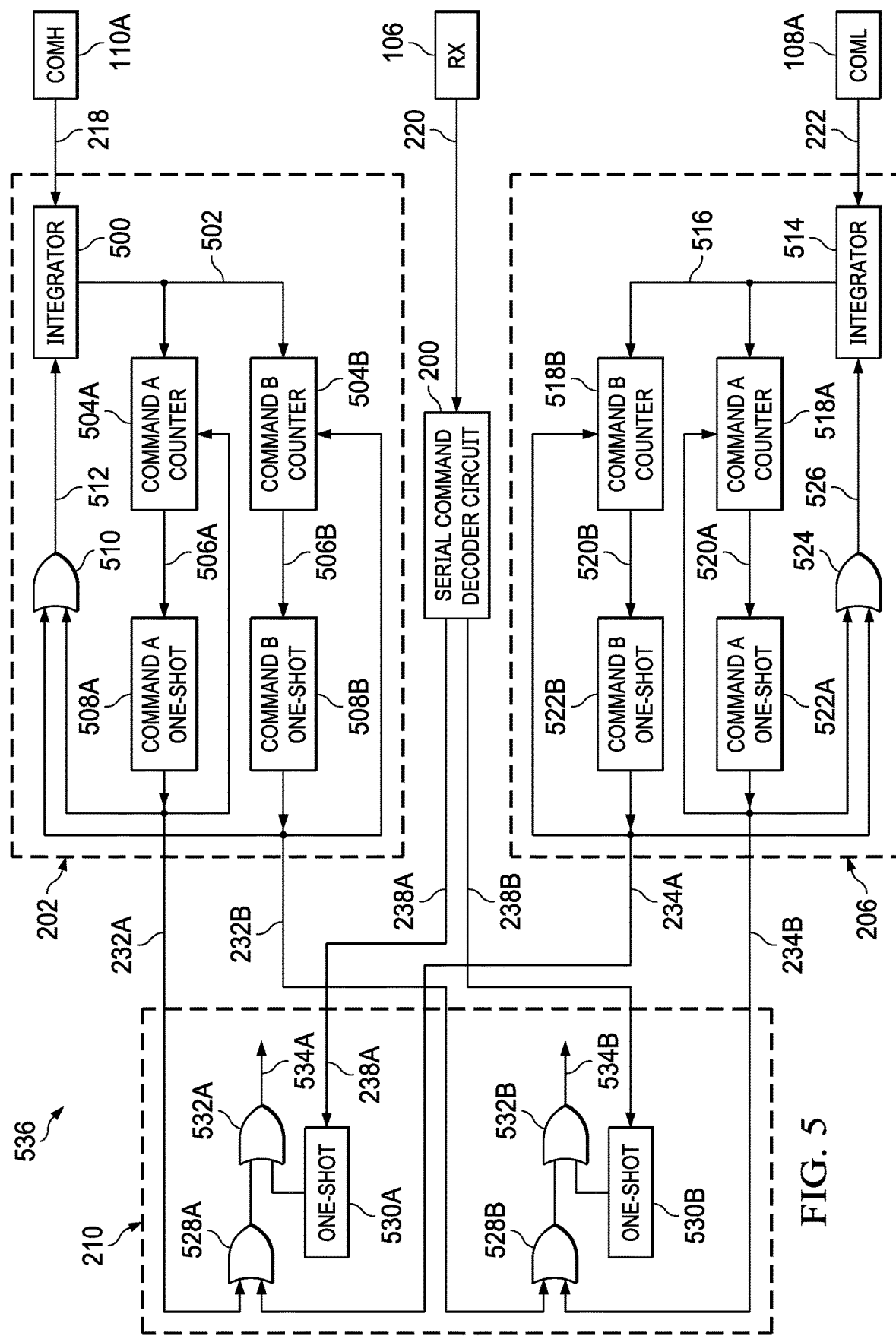
FIG. 5 depicts a schematic diagram of a command detection circuit of a battery cell monitoring circuit in accordance with various examples.

FIG. 5 depicts a schematic diagram of the serial communication command circuit 210 of a command detection circuit 536, in accordance with various examples. The command detection circuit 536 may be the command detection circuit 244 (FIG. 2) or 330 (FIG. 3), for example. In some examples, as discussed above with respect to FIG. 2, the command detection circuit 536 includes the COMH communication command detection circuit 202, the COML communication command detection circuit 206, and the serial communication command circuit 210. The COMH communication command detection circuit 202 includes an integrator circuit 500, counter circuits 504A, 504B, one-shot circuits 508A, 508B, and an OR gate 510. In some examples, the counter circuits 504A, 504B may be referred to as a counter circuit 504. In other examples, the one-shot circuits 508A, 508B may be referred to as a one-shot circuit 508. In further examples, the couplings of the components of the COMH communication command detection circuit 202 may be similar to the couplings of the component of the COMH reset command detection circuit 204. For example, the integrator circuit 500 couples to the COMH port 110A, the counter circuit 504, the one-shot circuit 508, and the OR gate 528; the counter circuit 504 couples to the one-shot circuit 508 and the OR gate 528; and the one-shot circuit 508 couples to the counter circuit 504 and the OR gate 528. However, because the COMH communication command detection circuit 202 may handle multiple different commands, the one-shot circuit 508, the counter circuit 504, and the OR gate 528 couple to the OR gate 510, which, in turn, couples to the integrator circuit 500.

In further examples, similar to the discussion above with respect to FIG. 3, the COML communication command detection circuit 206 includes components that are similar to the components of the COMH communication command detection circuit 202. For example, the COML communication command detection circuit 206 includes an integrator circuit 514, counter circuits 518A, 518B, one-shot circuits 522A, 522B, and an OR gate 524. In some examples, the counter circuits 518A, 518B may be referred to as a counter circuit 518. In other examples, the one-shot circuits 522A, 522B may be referred to as a one-shot circuit 522.

The serial communication command circuit 210 includes OR gates 528A, 528B, 532A, 532B and one-shot circuits 530A, 530B. In some examples, the OR gates 528A, 528B may be referred to as an OR gate 528 and the OR gates 532A, 532B may be referred to as an OR gate 532. In other examples, the one-shot circuits 530A, 530B may be referred to as a one-shot circuit 530. In further examples, the couplings of the components of the serial communication command circuit 210 may be similar to the couplings of the component of the reset command detection circuit 212. For example, the OR gate 528 couples to the counter circuits 504, 518; the one-shot circuits 508, 522; and the OR gate 532; the one-shot circuit 530 couples to the serial command decoder circuit 200 and the OR gate 532; and the OR gate 532 couples to the OR gate 528 and the one-shot circuit 530. However, because the COMH communication command detection circuit 202 and the COML communication command detection circuit 206 may handle multiple different commands, the OR gate 528 couples to the OR gates 510, 524 which, in turn, couple to the integrator circuits 500, 514, respectively.

While in some examples the COMH communication command detection circuit 202 and the COML communication command detection circuit 206 are illustrated as handling two commands, the COMH communication command detection circuit 202 and the COML communication command detection circuit 206 may handle any number of commands by increasing or by decreasing a number of counter circuits 504, 518 respectively, to equal the number of commands and by increasing or by decreasing a number of one-shot circuits 508, 522, respectively, to equal the number of commands. The serial communication command circuit 210 may handle any number of commands by increasing or by decreasing a number of OR gates 528 to equal the number of commands; by increasing or by decreasing a number of OR gates 532 to equal the number of commands and by increasing or by decreasing a number of one-shot circuits 530 to equal the number of commands. For example, counter circuit 504A, 518A; one-shot circuits 508A, 522A, 530A; and OR gates 528A, 532A process a command and counter circuits 504B, 518B; one-shot circuits 508B, 522B, 530B; and OR gates 528B, 532B process another command.

The COMH communication command detection circuit 202 includes multiple buses, including the bus 218; a bus 502; buses 506A, 506B; buses 232A, 238B; and a bus 512. The bus 218 couples an input terminal of the integrator circuit 500 to the COMH port 110A. The bus 502 couples an output terminal of the integrator circuit 500 to an input terminal of the counter circuits 504A, 504B. The buses 506A, 506B couple an output terminal of the counter circuits 504A, 504B, respectively to an input terminal of the one-shot circuits 508A, 508B, respectively. The buses 238A, 238B couple an output terminal of the one-shot circuits 508A, 508B, respectively, to a reset input terminal of the counter circuits 504A, 504B, respectively; to input terminals of the OR gate 510; and to input terminals of the OR gates 528A, 528B, respectively. The bus 512 couples an output terminal of the OR gate 510 to a reset input terminal of the integrator circuit 500. The COML communication command detection circuit 206 includes the bus 222; a bus 516; buses 520A, 520B; buses 234A, 234B; and a bus 526 that are similar to the couplings of the COMH communication command detection circuit 202. The serial communication command circuit 210 includes buses 232A, 232B; buses 234A, 234B; and buses 534A, 534B. The buses of the serial communication command circuit 210 are similar to the reset command detection circuit 212 discussed above with respect to FIG. 3 with an output terminal of the OR gates 532A, 532B propagating along the buses 534A, 534B, respectively, to other circuitry (not shown) of the battery cell monitoring circuit (e.g., 242 (FIG. 2)) to perform the command.

The operation of the COMH communication command detection circuit 202, the COML communication command detection circuit 206, and the serial communication command circuit 210 is similar to the discussion above with respect to FIG. 3. For example, when a signal is received at the COMH port 110A, the signal propagates along the bus 218 to the integrator circuit 500. The integrator circuit 500 generates an integrated signal based on the signal. The integrated signal is propagated to the counter circuits 504A, 504B. If a number of pulses of the integrated signal indicates the signal is a first command signal (e.g., wake command signal), then an output of the counter circuit 504A switches states, which, in turn, causes the one-shot circuit 508A to generate an output pulse. If the number of pulses of the integrated signal indicates the signal is a second command signal (e.g., heartbeat command signal), then an output of the counter circuit 504B switches states, which, in turn, causes the one-shot circuit 508B to generate an output pulse. The resulting output pulse resets the integrator circuit 500 by driving an output of the OR gate 510 high. The generated output pulse resets the associated counter circuit (e.g., 504A, 504B) and drives the associated OR gates (e.g., 528A, 532A; 528B, 532B) of the serial communication command circuit 210 to cause other circuitry (not shown) of the battery cell monitoring circuit (e.g., 242 (FIG. 2)) to perform the appropriate command.

Figure 6:
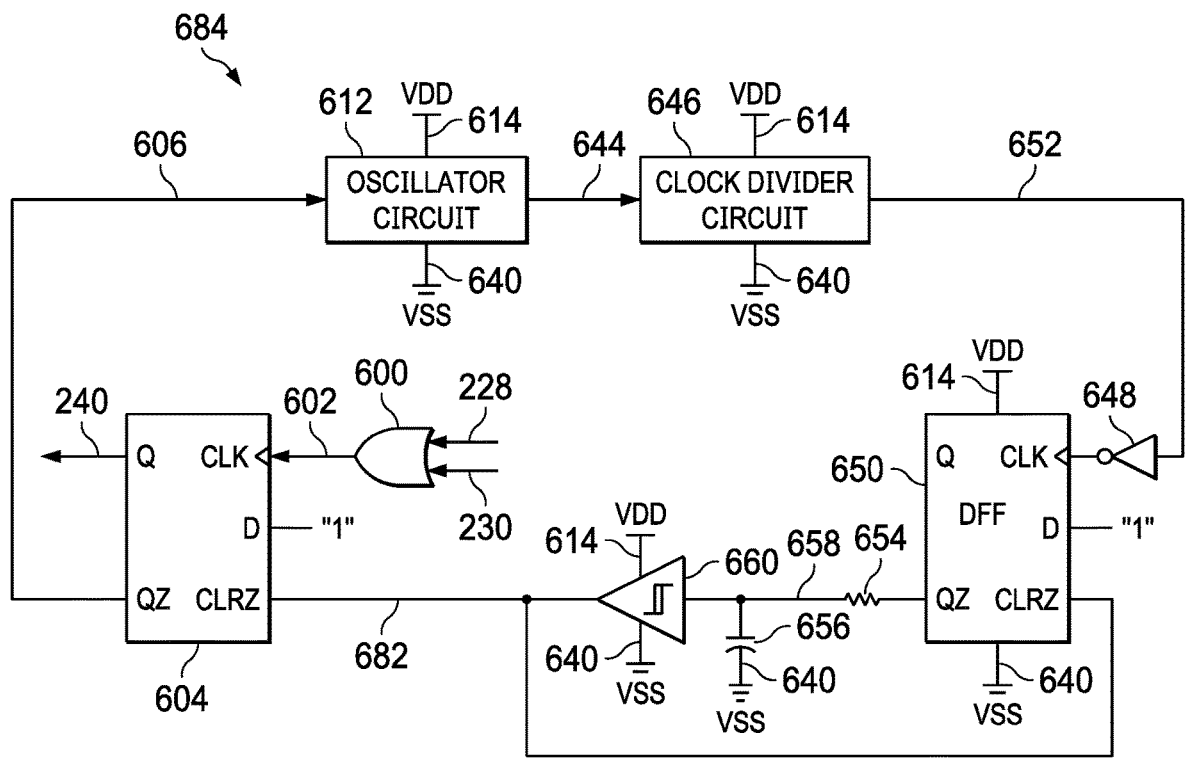
FIG. 6 depicts an analog reset circuit of a battery cell monitoring circuit in accordance with various examples.

FIG. 6 depicts an analog reset circuit 684 of a battery cell monitoring circuit in accordance with various examples. The analog reset circuit 684 may be the analog reset circuit 116A, 116B, 116C of the battery cell monitoring circuit 104A, 104B, 104C, respectively, for example. The analog reset circuit 684 includes an OR gate 600, D flip flops 604, 650, an oscillator circuit 612, a clock divider circuit 646, an inverter 648, a resistor 654, a capacitor 656, and a Schmitt trigger circuit 660. The OR gate 600 couples to the D flip flop 604. The D flip flop 604 couples to the OR gate 600, the oscillator circuit 612, the Schmitt trigger circuit 660, and the D flip flop 650. The oscillator circuit 612 couples to the D flip flop 604 and the clock divider circuit 646. The clock divider circuit 646 couples to the oscillator circuit 612 and the inverter 648. The inverter 648 couples to the clock divider circuit 646 and the D flip flop 650. The D flip flop 650 couples to the inverter 648, a first terminal of the resistor 654, and the D flip flop 604. A second terminal of the resistor 654 couples to a first terminal of the capacitor 656 and the Schmitt trigger circuit 660. The second terminal of the capacitor 656 couples to a ground terminal VSS. The Schmitt trigger circuit 660 couples to the first terminal of the capacitor 656 and the D flip flops 604, 650.

The analog reset circuit 684 includes the bus 228, the bus 230, the bus 240, a bus 602, a bus 606, a bus 614, a bus 640, a bus 644, a bus 652, a bus 658, and a bus 682. The bus 228 couples the output terminal of the reset command detection circuit 212 (FIGS. 1 and 2) to an input terminal of the OR gate 600. The bus 230 couples the output terminal of a power monitor circuit (e.g., 114A (FIG. 1), 418 (FIG. 4)) to another input terminal of the OR gate 600. The bus 240 couples to an output terminal Q of the D flip flop 604 and to LDO circuits (e.g., 118A (FIGS. 1 and 2). The bus 602 couples an output terminal of the OR gate 600 to an input terminal CLK of the D flip flop 604. The bus 606 couples an output terminal QZ of the D flip flop 604 to an enable input terminal of the oscillator circuit 612. The bus 614 couples to a voltage source that provides a voltage VDD. The bus 640 couples to a ground terminal that provides a signal VSS. In some examples, the signal VSS is the common ground GND terminal (FIG. 2). The bus 644 couples an output terminal of the oscillator circuit 612 to an input terminal of the clock divider circuit 646. The bus 652 couples to an output terminal of the clock divider circuit 646 and an input terminal of the inverter 648. The bus 658 couples a first terminal of the resistor 654, a first terminal of the capacitor 656, and an input of the Schmitt trigger circuit 660. The bus 682 couples an output terminal of the Schmitt trigger circuit 660 to an input CLRZ terminal of the D flip flop 604 and an input CLRZ terminal of the D flip flop 650.

The operation of analog reset circuit 684 is now described. The input terminal D of the D flip flop 604 couples to a high signal, as indicated by the "1," and outputs Q and QZ of the D flip flop 604 are latched when the input CLK of the D flip flop 604 transitions high. When either a signal on the bus 228 or a signal on the bus 230 is high, then the input CLK of the D flip flop 604 transitions high. When the input CLK of the D flip flop 604 transitions high, the output Q of the D flip flop 604 is latched high and the output QZ of the D flip flop 604 is latched low. For example, when the power monitor circuit 418 generates a signal on the bus 230 indicating a voltage based on the voltage CVDD is below a predetermined threshold (refer to discussion with respect to FIG. 4) then the output QZ of the D flip flop 604 is latched low. In another example, when the reset command detection circuit 212 generates a signal on the bus 228 indicating the battery cell monitoring circuit 242 (FIG. 2) is to be reset (refer to discussion with respect to FIGS. 2, 3, and 7), then the output QZ of the D flip flop 604 is latched low.

When the output Q of the D flip flop is high, the high signal propagates along the bus 240 to disable an enable pin of LDO circuits 118A. When the output QZ of the D flip flop 604 is low, an enable input of the oscillator circuit 612 is enabled. When the oscillator circuit 612 is enabled, the oscillator circuit 612 generates an output pulse on the bus 644. The clock divider circuit 646 generates another output pulse having a duration based on a frequency of the oscillator circuit 612 and a predetermined integer. The predetermined integer is determined by a frequency of the oscillator circuit 612 and a duration sufficient to discharge a residual voltage of power to circuits of the battery cell monitoring circuit (e.g., 242 (FIG. 2)). The predetermined integer may be configured utilizing hardware or machine-readable instructions. The clock divider circuit 646 may receive a stream of pulses at an input terminal. Based on the predetermined integer, the clock divider circuit 646 passes only a fraction of the pulses on as an output. Because the clock divider circuit 646 passes a fraction of the pulses, the clock divider circuit 646 may be referred to as a pulse divider. For example, if the predetermined integer of the clock divider circuit 646 is thirty-two, then thirty-two clock pulses occur before the output of the clock divider circuit 646 goes high and another thirty-two pulses occur before the output of the clock divider circuit 646 goes low. The duration during which the output of the clock divider circuit 646 is high may be referred to as a pulse duration of the clock divider circuit 646. In some examples, as discussed below with respect to FIGS. 7 and 8, the pulse duration of the clock divider circuit 646 may be between 30 and 50 milliseconds (ms). The another output pulse propagates along the bus 652 to the inverter 648. Because the another output pulse is high, the output of the inverter 648 is low and the D flip flop 650 remains in a previous state.

When the another pulse transitions low after the duration sufficient to discharge the residual voltage has elapsed, the low another pulse drives an output of the inverter 648 high. The high output of the inverter 648 latches the output QZ of the D flip flop 650 high. The resistor 654 and the capacitor 656 filter the signal from the output QZ of the D flip flop 650. The filtered output is an input into the Schmitt trigger circuit 660. The Schmitt trigger circuit 660 is configured to output a low signal. The low output signal of the Schmitt trigger circuit 660 drives the CLRZ input of the D flip flop 604 low. When the CLRZ input of the D flip flop 604 is low, the output QZ of the D flip flop 604 transitions high and the output Q of the D flip flop 604 transitions low. When the output Q of the D flip flop 604 transitions low, the enable pin of LDO circuits 118A is re-enabled. When the output QZ of the D flip flop 604 transitions high, the enable input of the oscillator circuit 612 is disabled. The output of the analog reset circuit 116A remains low until another signal is received either on the bus 228 or the bus 230.

Figure 7:
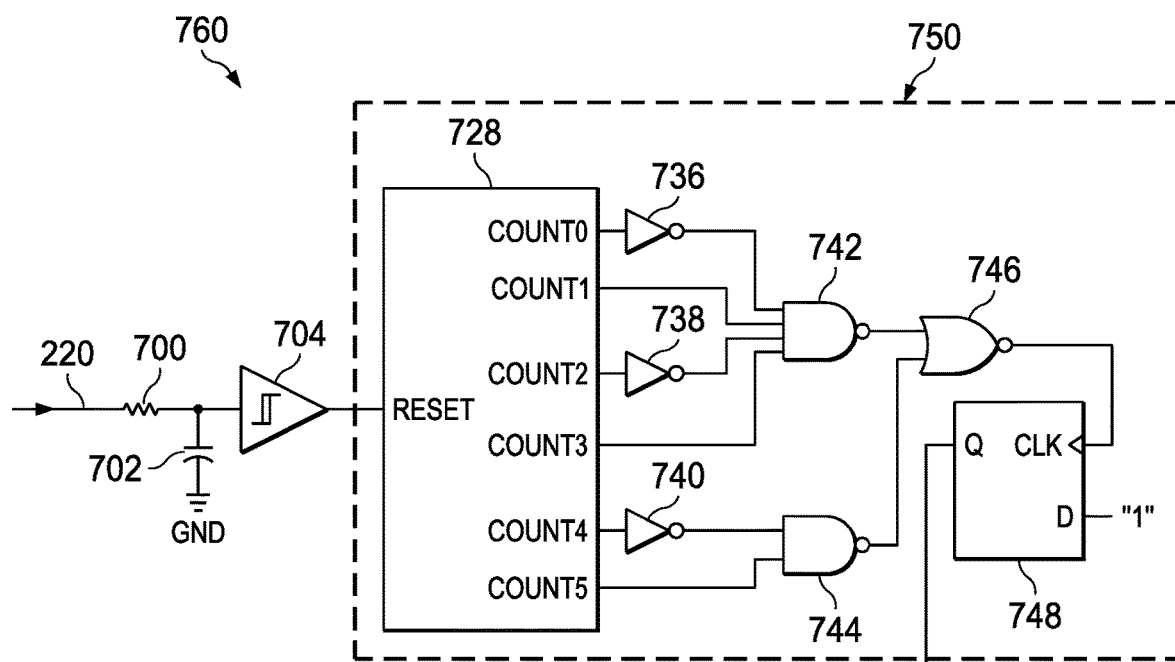
FIG. 7 depicts a command decoder circuit of a battery cell monitoring circuit in accordance with various examples.

FIG. 7 depicts the serial command decoder circuit 760 of a battery cell monitoring circuit in accordance with various examples. The serial command decoder circuit 760 may be the serial command decoder circuit 200 of the battery cell monitoring circuit 242, for example. In other examples, the battery cell monitoring circuit may be the battery cell monitoring circuit 104A, 104B or 104C. The serial command decoder circuit 760 includes a resistor 700; a capacitor 702; a Schmitt trigger circuit 704; and a counter circuit 750. In further examples, the counter circuit 750 includes a counter integrated circuit (IC) 728; inverters 736, 738, 740; NAND gates 742, 744; a NOR gate 746; and a D flip flop 748. A first terminal of the resistor 700 couples to the bus 220 (FIG. 2). A second terminal of the resistor 700 couples to a first terminal of the capacitor 702 and the Schmitt trigger circuit 704. A second terminal of the capacitor 702 couples to the GND terminal (FIG. 2). The Schmitt trigger circuit 704 couples to the second terminal of the resistor 700, the first terminal of the capacitor 702, and the counter circuit 750.

In further examples, the counter IC 728 couples to the Schmitt trigger circuit 704, inverters 736, 738, 740, and NAND gates 742, 744. Inverter 736 couples to the counter IC 728 and the NAND gate 742. Inverter 738 couples to the counter IC 728 and the NAND gate 742. Inverter 740 couples to the counter IC 728 and the NAND gate 744. The NAND gate 742 couples to the inverters 736, 738, the counter IC 728, and the NOR gate 746. The NAND gate 744 couples to the inverter 740, the counter IC 728, and the NOR gate 746. The NOR gate 746 couples to the NAND gates 742, 744 and the D flip flop 748. The D flip flop 748 couples to the NOR gate 746 and the bus 236 (FIG. 2).

The serial command decoder circuit 760 includes the bus 220 and the bus 236. The bus 220 couples to a first terminal of the resistor 700 and to the RX port 106 (FIGS. 1 and 2). A second terminal of the resistor 700 couples to a first terminal of the capacitor 702 and an input terminal of the Schmitt trigger circuit 704. An output terminal of the Schmitt trigger circuit 704 couples to an input terminal of the counter circuit 750. The bus 236 couples to an output terminal of the counter circuit 750 and to the one-shot circuit 320 (FIG. 3).

The operation of the serial command decoder circuit 760 is now described. The resistor 700, the capacitor 702, and the Schmitt trigger circuit 704 deglitch a signal on the bus 220. The counter circuit 750 receives the deglitched input signal at an input terminal RESET. If a number of clock cycles of the deglitched signal indicates the deglitched signal is a reset command signal, then an output signal of the counter circuit 750 on the bus 236 switches states. For example, assume Count0 is low, Count1 is high, Count2 is low, Count3 is high, Count4 is low, and Count5 is high of the counter circuit 750. The inverters 736, 738, 740 invert Count®, Count2, and Count 4 resulting in all high inputs to the NAND gates 742, 744. The all high inputs result in low inputs to the NOR gate 746. The low inputs to the NOR gate 746 drives an output of the NOR gate 746 high. The high output of the NOR gate 746 triggers a clock input of the D flip flop 748. The high clock input latches a Q output of the D flip flop 748 high because an input D of the D flip flop 748 is always high. Referring briefly now to FIG. 3, in response to the switched state of the counter circuit 750, the one-shot circuit 320 generates a pulse that propagates along the bus 328 to drive the output of the OR gate 324 high. The high output signal of the OR gate 324 propagates along the bus 228 to the analog reset circuit 116A. Refer to FIG. 6 for an illustrative example of the analog reset circuit 116A processing the high output signal received via the bus 236.

Figure 8:
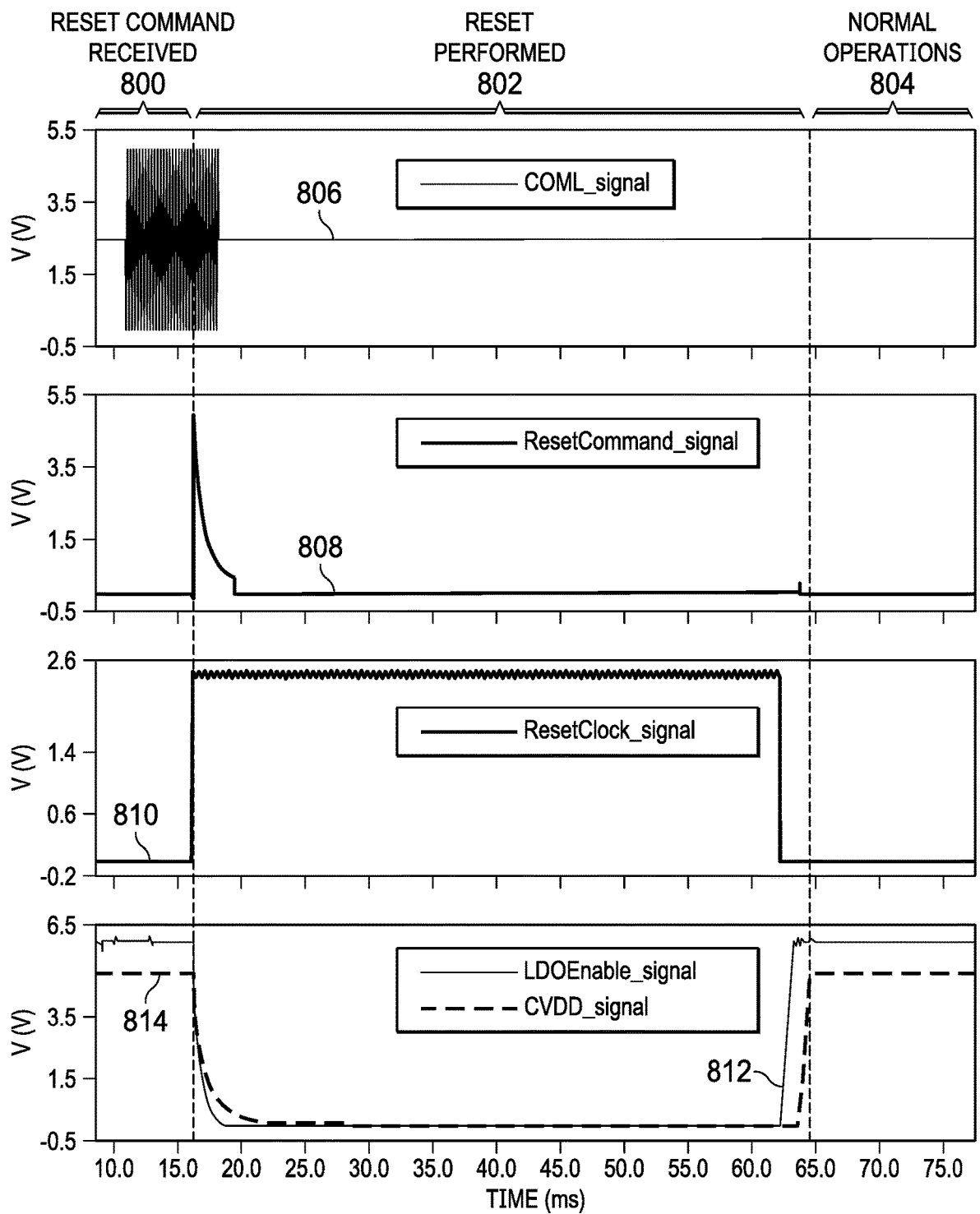
FIG. 8 depicts a timing diagram of a reset of a battery cell monitoring circuit in accordance with various examples.

Referring now to FIG. 8, a timing diagram of a reset of a battery cell monitoring circuit is presented in accordance with various examples. The battery cell monitoring circuit may be the battery cell monitoring circuit 104A, 104B, 104C, or 242, for example. A COML_signal 806 corresponds to a signal received from a device coupled to the battery cell monitoring circuit. The device may be another battery cell monitoring circuit, for example. A ResetCommand_signal 808 corresponds to a signal generated by a reset command circuit. The reset command circuit may be the reset command detection circuit 212, for example. A ResetClock_signal 810 corresponds to a signal generated by an analog reset circuit. The analog reset circuit may be the analog reset circuit 116A, 116B, 116C, or 684, for example. An LDOEnable_signal 812 corresponds to a signal received by an LDO circuit. The LDO circuit may be the LDO circuits 118A, 118B, or 118C, for example. A CVDD_signal 814 corresponds to the voltage CVDD. A y-axis of the COML_signal 806 timing diagram, of the ResetCommand_signal 808 timing diagram, of the ResetClock_signal 810 timing diagram, of the LDOEnable_signal 812 timing diagram, and of the CVDD_signal 814 timing diagram indicates a voltage measurement in volts (V). An x-axis of the COML_signal 806 timing diagram, of the ResetCommand_signal 808 timing diagram, of the ResetClock_signal 810 timing diagram, of the LDOEnable_signal 812 timing diagram, and of the CVDD_signal 814 timing diagram indicates a time measurement in milliseconds (ms).

Referring to the waveforms of FIG. 8 along with FIGS. 1, 2, and 6, in some examples, during a reset command received 800 time frame, the battery cell monitoring circuit 104A receives a signal at the COML port 108A from the battery cell monitoring circuit 104C. The COML reset command detection circuit 208 determines the signal is a reset command signal and the reset command detection circuit 212 generates a signal having a high voltage as indicated by the 5.5V spike of the ResetCommand_signal 808. In response to the high voltage signal, the analog reset circuit 116A generates a pulse having a high voltage, as indicated by the change in voltage of ResetClock_signal 810 from 0V to 2.6V. The pulse drives the enable pins of the LDO circuits 118A low, as indicated by the drop from 6V to 0V of the LDOEnable_signal 812. Because an LDO circuit of the LDO circuits 118A supplies the voltage CVDD, the CVDD_signal 814 is driven low, as indicated by the drop from 5V to 0V.

During a reset performed 802 time frame, the pulse generated by the analog reset circuit 116A remains high, as indicated by the 2.6V of the ResetClock_signal 810. The high voltage pulse continues to drive the enable pins of the LDO circuits 118A low, as indicated by the 0V of the LDOEnable_signal 812 and the 0V of the CVDD_signal 814. After a duration sufficient to drain residual voltage has elapsed, the pulse generated by the analog reset circuit 116A goes low, as indicated by a drop from 2.6V to 0V of the ResetClock_signal 810 after approximately 46 ms has elapsed. The enable pins of the LDO circuits 118A are driven high, as indicated by the rise from 0V to 6V of the LDOEnable_signal 812. The voltage CVDD rises to 5V, as indicated by the CVDD_signal 814.

During a normal operations 804 time frame, a voltage of ResetCommand_signal 808 of the COML reset command detection circuit 208 remains low as other commands that are not reset commands are received, as indicated by the 0V of ResetCommand_signal 808. The LDO circuits 118A continue to supply voltage to the battery cell monitoring circuit 104A, as indicated by the 6V of the LDOEnable_signal 812. The voltage CVDD of the reset command detection circuit remains high, as indicated by the CVDD_signal 814.

Figure 9:
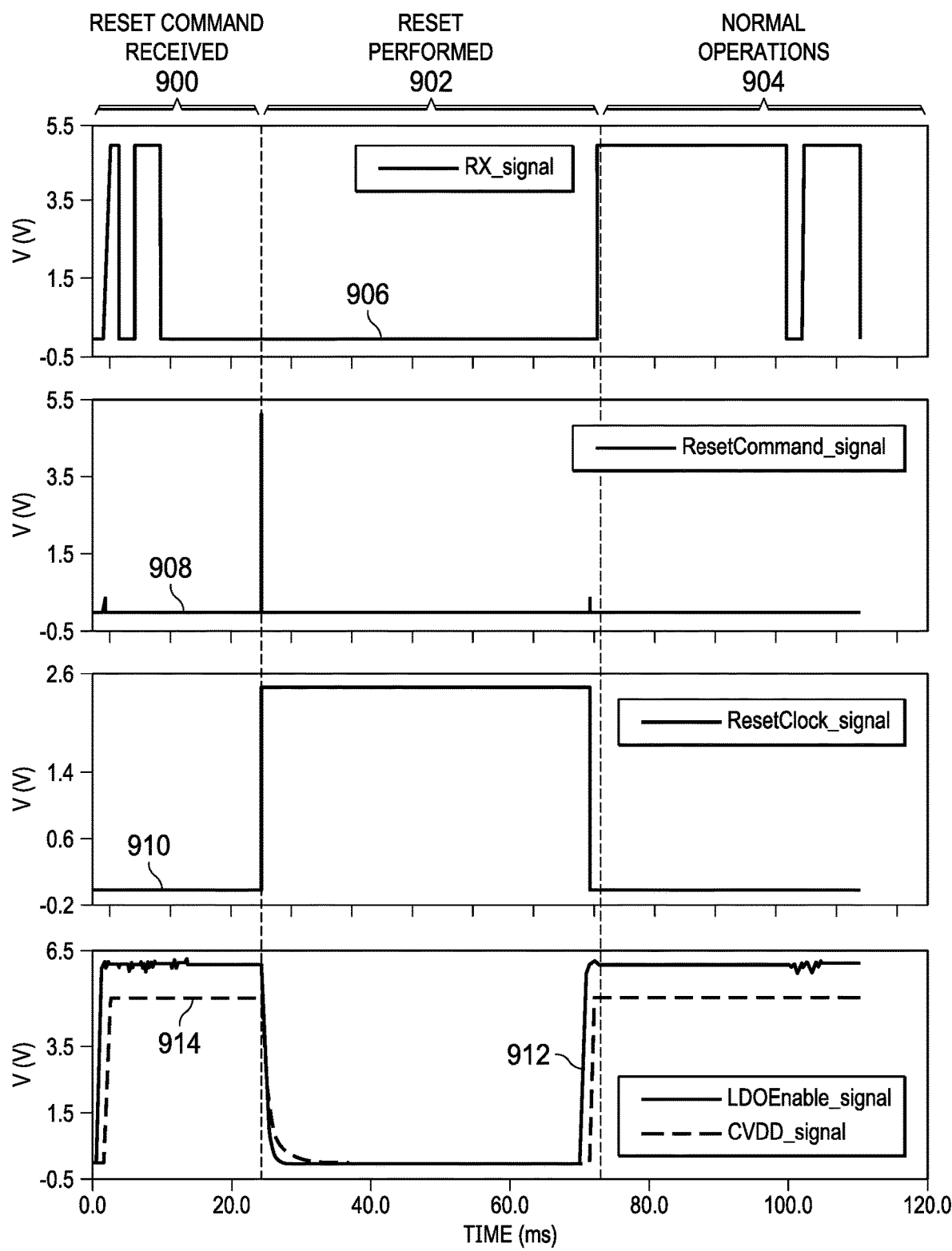
FIG. 9 depicts a timing diagram of a reset of a battery cell monitoring circuit in accordance with various examples.

Referring now to FIG. 9, a timing diagram of a reset of a battery cell monitoring circuit is presented in accordance with various examples. The battery cell monitoring circuit may be the battery cell monitoring circuit 104A, for example. An RX_signal 906 corresponds to a signal received from a device coupled to the battery cell monitoring circuit. The device may be the processor 102, for example. A ResetCommand_signal 908 corresponds to a signal generated by a reset command circuit. The reset command circuit may be the reset command detection circuit 212, for example. A ResetClock_signal 910 corresponds to a signal generated by an analog reset circuit. The analog reset circuit may be the analog reset circuit 116A, for example. A LDOEnable_signal 912 corresponds to a signal received by LDO circuits. The LDO circuits may be the LDO circuits 118A, for example. A CVDD_signal 914 corresponds to the voltage CVDD. A y-axis of the RX_signal 906 timing diagram, of the ResetComand_signal 908 timing diagram, of the ResetClock_signal 910 timing diagram, of the LDOEnable_signal 912 timing diagram, and of the CVDD_signal 914 timing diagram indicates a voltage measurement in volts (V). An x-axis of the RX_signal 906 timing diagram, of the ResetCommand_signal 908 timing diagram, of the ResetClock_signal 910 timing diagram, of the LDOEnable_signal 912 timing diagram, and of the CVDD_signal 914 timing diagram indicates a time measurement in milliseconds (ms).

Referring to the waveforms of FIG. 9 along with along with FIGS. 1, 2, and 6, in some examples, during a reset command received 900 time frame, the battery cell monitoring circuit 104A receives a signal on the bus 220 from the processor 102. The serial command decoder circuit 200 determines the signal is a reset command and the reset command detection circuit 212 generates a signal having a high voltage as indicated by the 5.2V spike of the ResetCommand_signal 908. In other examples, the serial command decoder circuit may be the serial command decoder circuit 684. In response to the high voltage signal, the analog reset circuit 116A generates a pulse having a high voltage, as indicated by the change in voltage of ResetClock_signal 910 from 0V to 2.6V. The pulse drives the enable pins of the LDO circuits 118A low, as indicated by the drop from 6V to 0V of the LDOEnable_signal 912. Because an LDO circuit of the LDO circuits supplies the voltage CVDD, the CVDD_signal 914 is driven low, as indicated by the drop from 5V to 0V.

During a reset performed 902 time frame, the pulse generated by the analog reset circuit 116A remains high, as indicated by the 2.6V of the ResetClock_signal 910. The high voltage pulse continues to drive the enable pins of the LDO circuits 118A low, as indicated by the 0V of the LDOEnable_signal 912 and the 0V of the CVDD_signal 914. After a duration sufficient to drain residual voltage has elapsed, the pulse generated by the analog reset circuit 116A drops low, as indicated by drop from 2.6V to 0V of the ResetClock_signal 910 after approximately 46 ms has elapsed. The enable pins of the LDO circuits 118A are driven high, as indicated by the rise from 0V to 6V of the LDOEnable_signal 912. The voltage CVDD of the reset command detection circuit 212 rises to 5V, as indicated by the CVDD_signal 914.

During a normal operations 904 time frame, a voltage of the ResetCommand_signal 908 remains low as other commands that are not reset commands are received, as indicated by the 0V of ResetCommand_signal 908. The LDO circuits 118A continue to supply voltage to the battery cell monitoring circuit 104A, as indicated by the 6V of the LDOEnable_signal 912. The voltage CVDD of the reset command detection circuit 212 remains high, as indicated by the 5V of the CVDD_signal 914.

Figure 10:
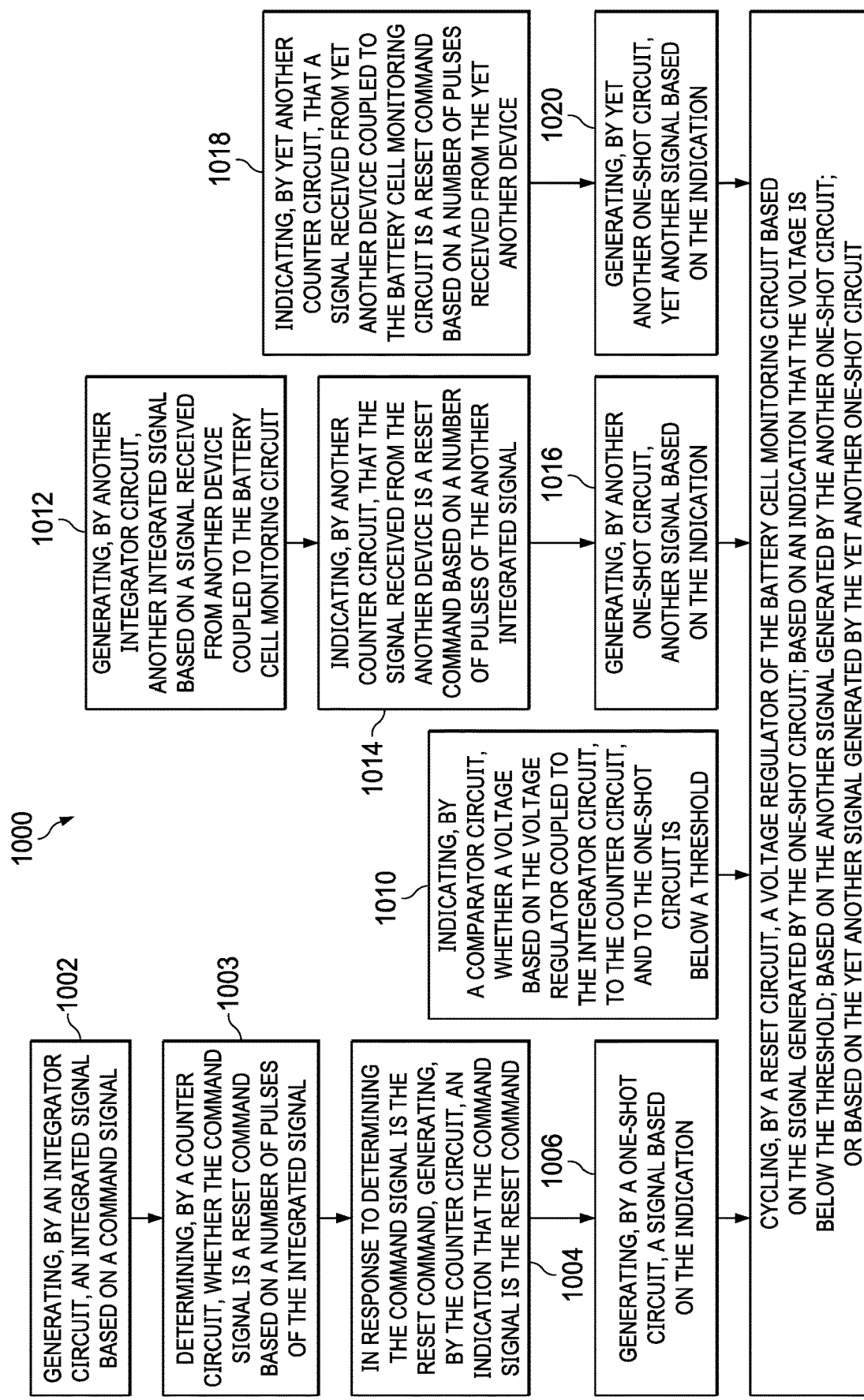
FIG. 10 depicts a flowchart of a method for resetting a battery cell monitoring circuit in accordance with various examples.

Referring now to FIG. 10, a flowchart of a method 1000 for resetting a battery cell monitoring circuit is presented in accordance with various examples. The battery cell monitoring circuit may be the battery cell monitoring circuit 104A, 1046, 104C, or 242, for example. The method 1000 includes generating, by an integrator circuit, an integrated signal based on a command signal received from a device coupled to a battery cell monitoring circuit (1002). The integrator circuit may be the integrator circuit 300, for example. The integrated signal may be the signal on the bus 306, for example. The command signal may be the signal on the bus 218, for example. The device coupled to the battery cell monitoring circuit may be the battery cell monitoring circuit 104B, for example. The method 1000 also includes determining, by a counter circuit, whether the command signal is a reset command based on a number of pulses of the integrated signal (1003). The counter circuit may be the counter circuit 302, for example. Additionally, the method 1000 includes, in response to determining the command signal is the reset command, generating, by the counter circuit, an indication that the command signal is the reset command (1004). The method 1000 further includes generating, by a one-shot circuit, a signal based on an indication that the command signal is a reset command (1006). The one-shot circuit may be the one-shot circuit 304, for example. The signal may be the signal on the bus 224, for example. The method 1000 also includes cycling, by a reset circuit, a voltage regulator of the battery cell monitoring circuit based on the signal generated by the one-shot circuit (1008). The reset circuit may be the analog reset circuit 116A (FIG. 1) or 684 (FIG. 6), for example. The voltage regulator may be an LDO circuit of the LDO circuits 118A, for example.

In further examples, the method 1000 also includes indicating, by a comparator circuit, whether a voltage based on the voltage regulator coupled to the integrator circuit, to the counter circuit, and to the one-shot circuit is below a threshold (1010). The comparator circuit may be the comparator circuit of the power monitor circuit 418 (FIG. 4), for example. Additionally, the method 1000 includes cycling, by the reset circuit, the voltage regulator of the battery cell monitoring circuit based on an indication that the voltage is below the threshold (1008).

In further examples, the method 1000 also includes generating, by another integrator circuit, another integrated signal based on a signal received from another device coupled to the battery cell monitoring circuit (1012). The another integrator circuit may be the integrator circuit 310, for example. The another integrated signal may be the signal on the bus 316, for example. The signal received from the another device may be the signal on the bus 226, for example. The another device may be the battery cell monitoring circuit 104C, for example. Additionally, the method 1000 includes indicating, by another counter circuit, whether the signal received from the another device is a reset command based on a number of pulses of the another integrated signal (1014). The another counter circuit may be the counter circuit 312, for example. In addition, the method 1000 includes generating, by another one-shot circuit, another signal based on an indication that the signal received from the another device is a reset command (1016). The another one-shot circuit may be the one-shot circuit 314, for example. The signal generated by the another one-shot circuit may be the signal on the bus 226, for example. The method 1000 also includes cycling, by the reset circuit, the voltage regulator of the battery cell monitoring circuit based on the another signal generated by the another one-shot circuit (1008).

In further examples, the method 1000 also includes indicating, by yet another counter circuit, whether a signal received from yet another device coupled to the battery cell monitoring circuit is a reset command based on a number of pulses of the signal received from the yet another device (1018). The yet another counter circuit may be the counter circuit 750, for example. The signal received from the yet another device may be the signal on the bus 220, for example. The yet another device may be the processor 102, for example. In addition, the method 1000 includes generating, by yet another one-shot circuit, yet another signal based on an indication that the signal received from the yet another device is a reset command (1020). The yet another one-shot circuit may be the one-shot circuit 320, for example. Additionally, the method includes cycling, by the reset circuit, the voltage regulator of the battery cell monitoring circuit based on the yet another signal generated by the yet another one-shot circuit (1008).

Figure 11:
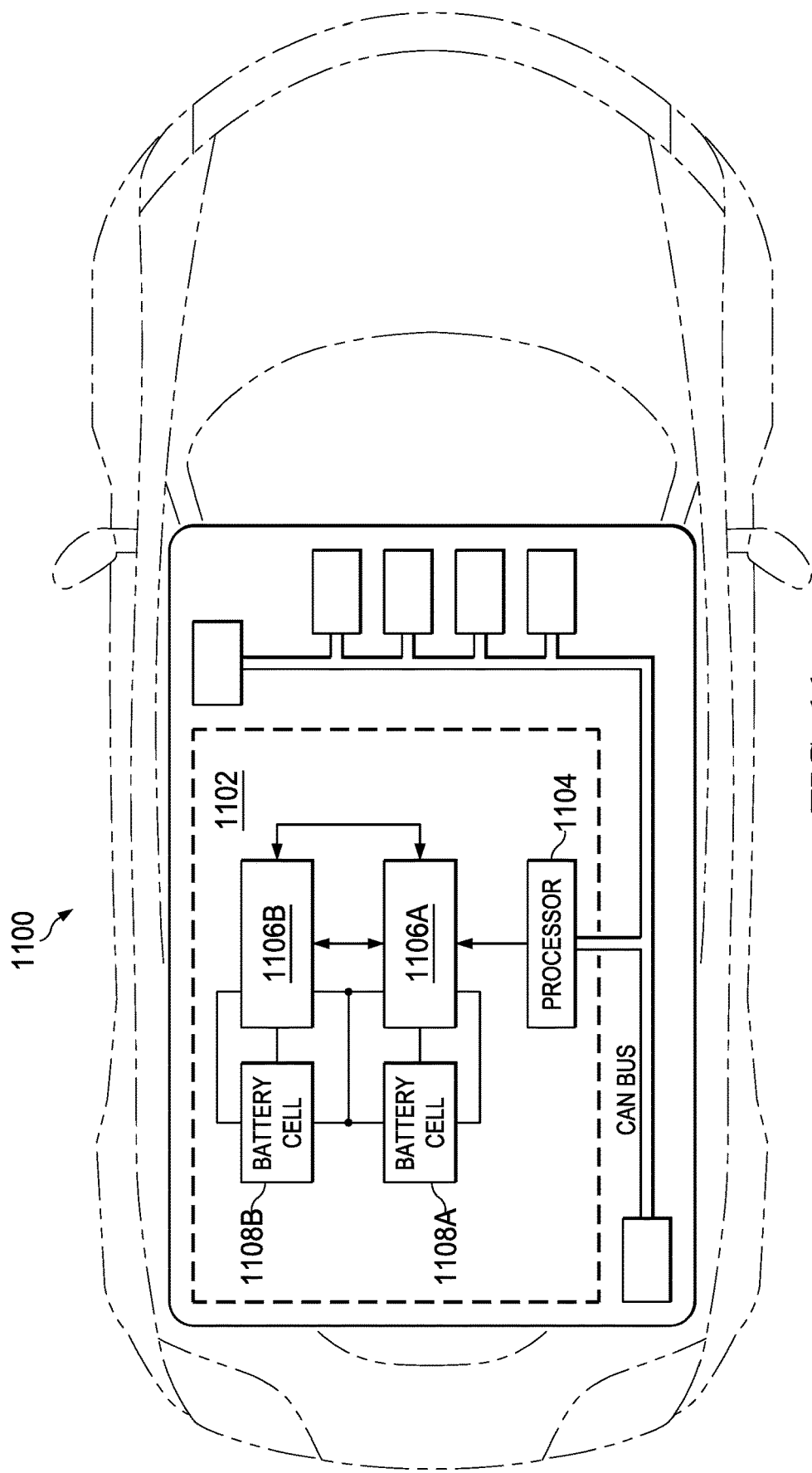
FIG. 11 depicts a battery management system of a vehicle system in accordance with various examples.

FIG. 11 depicts the battery management system 100 of a vehicle system 1100 in accordance with various examples. The battery management system 1102 includes the processor 1104, the battery cell monitoring circuits 1106A, 11066, and the battery cells 1108A, 1108B. The battery management system 1102 may be the battery management system 100, for example. The processor 1104 may be the processor 102, for example. The battery cell monitoring circuits 1106A, 10066 may be the battery cell monitoring circuits 104A, 1046, respectively, for example. The battery cells 1108A, 10086 may be the battery cells 124A, 124B, for example. The components are coupled as discussed above with respect to FIG. 1. Implementing the battery management system 1102 in accordance with the various examples discussed above, may allow the vehicle system 1100 to reset a locked up battery cell of the battery management system 1102 without the costs of disassembly (e.g., specialized equipment, specialized facilities, trained personnel, safety procedures, etc.) thereby reducing costs and increasing efficiency of repairs and reducing the time of unavailability of the vehicle system 1100 to the user.

The above discussion is meant to be illustrative of the principles and various embodiments of the present disclosure. Numerous variations and modifications will become apparent to those skilled in the art when the above disclosure is fully appreciated. The following claims embrace all such variations and modifications.

In the foregoing discussion and in the claims, the term "couple" or "couples" means either an indirect or direct connection. Thus, if a first device couples to a second device, that connection may be through a direct connection or through an indirect connection via other devices and connections. Similarly, a device that couples between a first component or location and a second component or location may be through a direct connection or through an indirect connection via other devices and connections. The term "couple" may cover connections, communications, or signal buses that enable a functional relationship consistent with the description of the present disclosure. For example, if device A generates a signal to control device B to perform an action, in a first example device A couples to device B, or in a second example device A couples to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party. Components illustrated as resistors, unless otherwise stated, are generally representative of any one or more elements coupled in series and/or parallel to provide an amount of impedance represented by the illustrated resistor.

Additionally, uses of the phrases "ground" or similar in the foregoing discussion include a chassis ground, an Earth ground, a floating ground, a virtual ground, a digital ground, a common ground, and/or any other form of ground connection applicable to, or suitable for, the teachings of the present disclosure.

What is claimed is:

1. A system, comprising:
   a battery cell; and
   a battery cell monitoring circuit coupled to the battery cell, the battery cell monitoring circuit configured to monitor a status of the battery cell, the battery cell monitoring circuit comprising:
   an integrator circuit configured to generate an integrated signal based on a first signal;
   a counter circuit coupled to the integrator circuit, the counter circuit configured to indicate whether the first signal is a reset command based on a number of pulses of the integrated signal;
   a one-shot circuit coupled to the counter circuit, the one-shot circuit configured to generate a second signal based on an indication from the counter circuit that the first signal is a reset command;
   a voltage regulator; and
   a reset circuit coupled to the one-shot circuit and to the voltage regulator, the reset circuit configured to cycle the voltage regulator in response to the second signal.

2. The system of claim 1, wherein the battery cell monitoring circuit is a first battery cell monitoring circuit and the battery cell is a first battery cell, the system further comprising a second battery cell monitoring circuit coupled to the first battery cell monitoring circuit, the second battery cell monitoring circuit configured to monitor a status of a second battery cell.

3. The system of claim 1, wherein the counter circuit is a first counter circuit and the one-shot circuit is a first one-shot circuit, the system further comprising:
   a second counter circuit configured to indicate whether a signal received from a processor coupled to the battery cell monitoring circuit is a reset command based on a number of pulses of the signal; and
   a second one-shot circuit coupled to the second counter circuit, the second one-shot circuit configured to generate a third signal based on an indication that the signal received from the processor is a reset command,
   wherein the reset circuit is configured to cycle the voltage regulator in response to the third signal.

4. The system of claim 1, further comprising:
   an analog reset circuit coupled to the voltage regulator and to the reset circuit; and a comparator circuit coupled to the analog reset circuit, the comparator circuit configured to generate a third signal in response to a voltage produced from the voltage regulator being below a predetermined threshold,
   wherein the reset circuit is configured to reset the voltage regulator in response to the third signal.

5. The system of claim 1, wherein the integrator circuit is a first integrator circuit, the counter circuit is a first counter circuit, and the one-shot circuit is a first one-shot circuit, the battery cell monitoring circuit further comprising:
   a second integrator circuit configured to generate a second integrated signal based on a fourth signal;
   a second counter circuit coupled to the second integrator circuit, the second counter circuit configured to indicate whether the fourth signal is a wake command based on a number of pulses of the second integrated signal; and
   a second one-shot circuit coupled to the second counter circuit, the second one-shot circuit configured to generate a fifth signal based on an indication that the fourth signal is a wake command.

6. The system of claim 1, the reset circuit comprising a logic gate coupled to the one-shot circuit, the logic gate configured to generate a third signal based on the second signal.

7. The system of claim 6, wherein the voltage regulator is configured to supply a voltage to the integrator circuit, to the counter circuit, to the one-shot circuit, and to the logic gate.

8. A system comprising:
   a first battery cell monitoring circuit;
   a second battery cell monitoring circuit; and
   a third battery cell monitoring circuit comprising:
   a first reset command detection circuit comprising a first integrator circuit coupled to the first battery cell monitoring circuit, a first counter circuit coupled to the first integrator circuit, and a first one-shot circuit coupled to the first counter circuit;
   a second reset command detection circuit comprising a second integrator circuit coupled to the second battery cell monitoring circuit, a second counter circuit coupled to the second integrator circuit, and a second one-shot circuit coupled to the second counter circuit;
   a voltage regulator; and
   a reset circuit configured to receive a first signal from the first reset command detection circuit and to receive a second signal from the second reset command detection circuit, the reset circuit configured to determine whether to reset the voltage regulator based on the first signal and the second signal.

9. The system of claim 8, the third battery cell monitoring circuit further comprising a command decoder circuit adapted to be coupled to a processor, the command decoder circuit comprising a third counter circuit, the reset circuit comprising:
   a first logic gate having a first logic input, a second logic input, and a first logic output, the first logic input coupled to the first one-shot circuit and the second logic input coupled to the second one-shot circuit;
   a third one-shot circuit coupled to an output terminal of the command decoder circuit; and
   a second logic gate having a third logic input, a fourth logic input, and a second logic output, the third logic input coupled to the third one-shot circuit and the fourth logic input coupled to the first logic output.

10. The system of claim 8, further comprising:
    a processor coupled to the third battery cell monitoring circuit;
    a first battery cell coupled to the first battery cell monitoring circuit;
    a second battery cell coupled to the second battery cell monitoring circuit; and
    a third battery cell coupled to the third battery cell monitoring circuit.

11. A method, comprising:
    generating, by an integrator circuit, an integrated signal based on a command signal; and
    in response to determining, by a counter circuit, that the command signal is a reset command based on a number of pulses of the integrated signal:
    generating, by the counter circuit, an indication that the command signal is the reset command;
    generating, by a one-shot circuit, a signal based on the indication; and
    cycling, by a reset circuit, a voltage regulator of a battery cell monitoring circuit based on the signal.

12. The method of claim 11, further comprising:
- indicating, by a comparator circuit, whether a voltage based on the voltage regulator is below a threshold; and
- cycling, by the reset circuit, the voltage regulator of the battery cell monitoring circuit based on an indication that the voltage is below the threshold.

13. The method of claim 11, wherein the integrator circuit is a first integrator circuit, the counter circuit is a first counter circuit, and the one-shot circuit is a first one-shot circuit, the method further comprising:
- generating, by a second integrator circuit, a second integrated signal based on a second command signal received from a second device coupled to the battery cell monitoring circuit;
- indicating, by a second counter circuit, that the second command signal is a reset command based on a number of pulses of the second integrated signal;
- generating, by a second one-shot circuit, a second signal based on the indication; and
- cycling, by the reset circuit, the voltage regulator of the battery cell monitoring circuit based on the second signal.

14. The method of claim 11, wherein the counter circuit is a first counter circuit and the one-shot circuit is a first one-shot circuit, the method further comprising:
- indicating, by a second counter circuit, that a second command signal received from a second device coupled to the battery cell monitoring circuit is a reset command based on a number of pulses of the second command signal;
- generating, by a second one-shot circuit, a second signal based on the indication; and
- cycling, by the reset circuit, the voltage regulator of the battery cell monitoring circuit based on the second signal.

* * * * *